United States Patent
Baugher

(10) Patent No.: US 10,366,849 B2
(45) Date of Patent: Jul. 30, 2019

(54) METHOD TO CREATE A REDUCED STIFFNESS MICROSTRUCTURE

(71) Applicant: Duality Reality Energy, LLC, West Carrollton, OH (US)

(72) Inventor: Jeffrey Paul Baugher, West Carrollton, OH (US)

(73) Assignee: DUALITY REALITY ENERGY, LLC, Aiken, SC (US)

( * ) Notice: Subject to any disclaimer, the term of this patent is extended or adjusted under 35 U.S.C. 154(b) by 633 days.

(21) Appl. No.: 14/737,478

(22) Filed: Jun. 11, 2015

(65) Prior Publication Data

US 2015/0279587 A1    Oct. 1, 2015

Related U.S. Application Data

(63) Continuation of application No. 13/135,424, filed on Jul. 5, 2011, now Pat. No. 9,085,454.

(51) Int. Cl.
*H01H 11/00* (2006.01)
*H01H 59/00* (2006.01)
(Continued)

(52) U.S. Cl.
CPC ............ *H01H 11/00* (2013.01); *B81B 3/007* (2013.01); *H01H 1/0036* (2013.01);
(Continued)

(58) Field of Classification Search
CPC ....... H01H 159/0009; H01H 2059/009; H01H 11/00; H01H 1/0036; H01H 2001/0063;
(Continued)

(56) References Cited

U.S. PATENT DOCUMENTS

| 3,940,637 A | 2/1976 | Ohigashi |
| 5,216,490 A | 6/1993 | Greieff et al. |

(Continued)

FOREIGN PATENT DOCUMENTS

JP    2006051598 A  *  2/2006

OTHER PUBLICATIONS

Dr. Ir. P. Boeraeve, Introduction to the Finite Element Method, Jan. 2010, p. 23 and pp. 34-36 (68 pages total length), Institut Gramme—LIEGE.

(Continued)

*Primary Examiner* — A. Dexter Tugbang
(74) *Attorney, Agent, or Firm* — Peloquin, PLLC; Mark S. Peloquin, Esq.

(57) ABSTRACT

Methods are described to create a reduced stiffness microstructure (RSM). A RSM is made by forming a first buckled membrane along a first buckling direction and forming a second buckled membrane along a second buckling direction. The second buckling direction is opposite to the first buckling direction and the first buckled membrane is in contact with the second buckled membrane over a contact area. Within an operating zone, a stiffness of the reduced stiffness microstructure during contact is less than an absolute value of a stiffness of at least one of the first buckled membrane, before contact, and the second buckled membrane, before contact, when the contact area translates along either one of the first buckling direction and the second buckling direction. In the operating zone the stiffness can approach or equal zero.

13 Claims, 22 Drawing Sheets

(51) Int. Cl.
  *H01H 1/00* (2006.01)
  *B81B 3/00* (2006.01)
(52) U.S. Cl.
  CPC . *H01H 59/0009* (2013.01); *B81B 2203/0127* (2013.01); *H01H 2001/0063* (2013.01); *H01H 2059/009* (2013.01); *H01H 2229/034* (2013.01); *Y10T 29/49005* (2015.01); *Y10T 29/49105* (2015.01); *Y10T 29/49124* (2015.01)
(58) Field of Classification Search
  CPC .......... H01H 2229/034; H01H 59/0009; B81B 3/007; B81B 2203/0127; Y10T 29/49005; Y10T 29/49105; Y10T 29/49124
  See application file for complete search history.

(56) References Cited

U.S. PATENT DOCUMENTS

| | | |
|---|---|---|
| 5,344,117 A | 9/1994 | Trah et al. |
| 6,118,250 A | 9/2000 | Hutchison et al. |
| 6,168,395 B1 | 1/2001 | Quenzer et al. |
| 6,309,077 B1 | 10/2001 | Saif et al. |
| 6,828,887 B2 | 12/2004 | Kubby et al. |
| 7,188,931 B2 | 3/2007 | Cabal et al. |
| 7,195,393 B2 | 3/2007 | Potter |
| 7,450,797 B2 | 11/2008 | German et al. |
| 7,667,375 B2 | 2/2010 | Berkcan et al. |
| 7,839,058 B1 | 11/2010 | Churchill |
| 8,614,518 B2 | 12/2013 | Li et al. |
| 9,076,961 B2 | 7/2015 | Baugher |
| 9,085,454 B2 | 7/2015 | Baugher |
| 2005/0046541 A1 | 3/2005 | Fouillet |
| 2005/0134149 A1 | 6/2005 | Deng et al. |
| 2006/0006484 A1 | 1/2006 | Seneviratne et al. |
| 2006/0050028 A1* | 3/2006 | Pasch ................. H01H 59/0009 345/76 |
| 2006/0168788 A1* | 8/2006 | Tilmans ............. H01H 59/0009 29/25.35 |
| 2006/0175937 A1 | 8/2006 | Clingman |
| 2007/0092180 A1 | 4/2007 | Hashimura et al. |
| 2007/0188136 A1 | 8/2007 | Oh |
| 2007/0188846 A1* | 8/2007 | Slicker ................. H01H 1/0036 359/290 |
| 2007/0278600 A1 | 12/2007 | Zhan et al. |
| 2008/0135385 A1* | 6/2008 | Steeneken .......... H01H 59/0009 200/181 |
| 2008/0136292 A1 | 6/2008 | Thiesen |
| 2008/0202845 A1 | 8/2008 | Klein et al. |
| 2008/0237024 A1* | 10/2008 | Millet ................ H01H 59/0009 200/600 |
| 2009/0272200 A1 | 11/2009 | Frahnow et al. |
| 2010/0003575 A1 | 1/2010 | Schaevitz et al. |
| 2010/0171393 A1 | 7/2010 | Pie |
| 2010/0301699 A1 | 12/2010 | Zhang |
| 2012/0017978 A1 | 1/2012 | Doraiswami et al. |
| 2012/0169064 A1 | 7/2012 | Hoffman et al. |

OTHER PUBLICATIONS

Popescu et al., Buckled Membranes for Microstructures, 1994, IEEE reviews, pp. 188-192.
Notification Of Transmittal of the International Search Report and Written Opinion for Application PCT/US2012/000309, International Filing Date Jul. 5, 2012 (5 pages).
Written Opinion of the International Searching Authority for Application PCT/US2012/000309, International Filing Date Jul. 3, 2012 (5 pages).

* cited by examiner

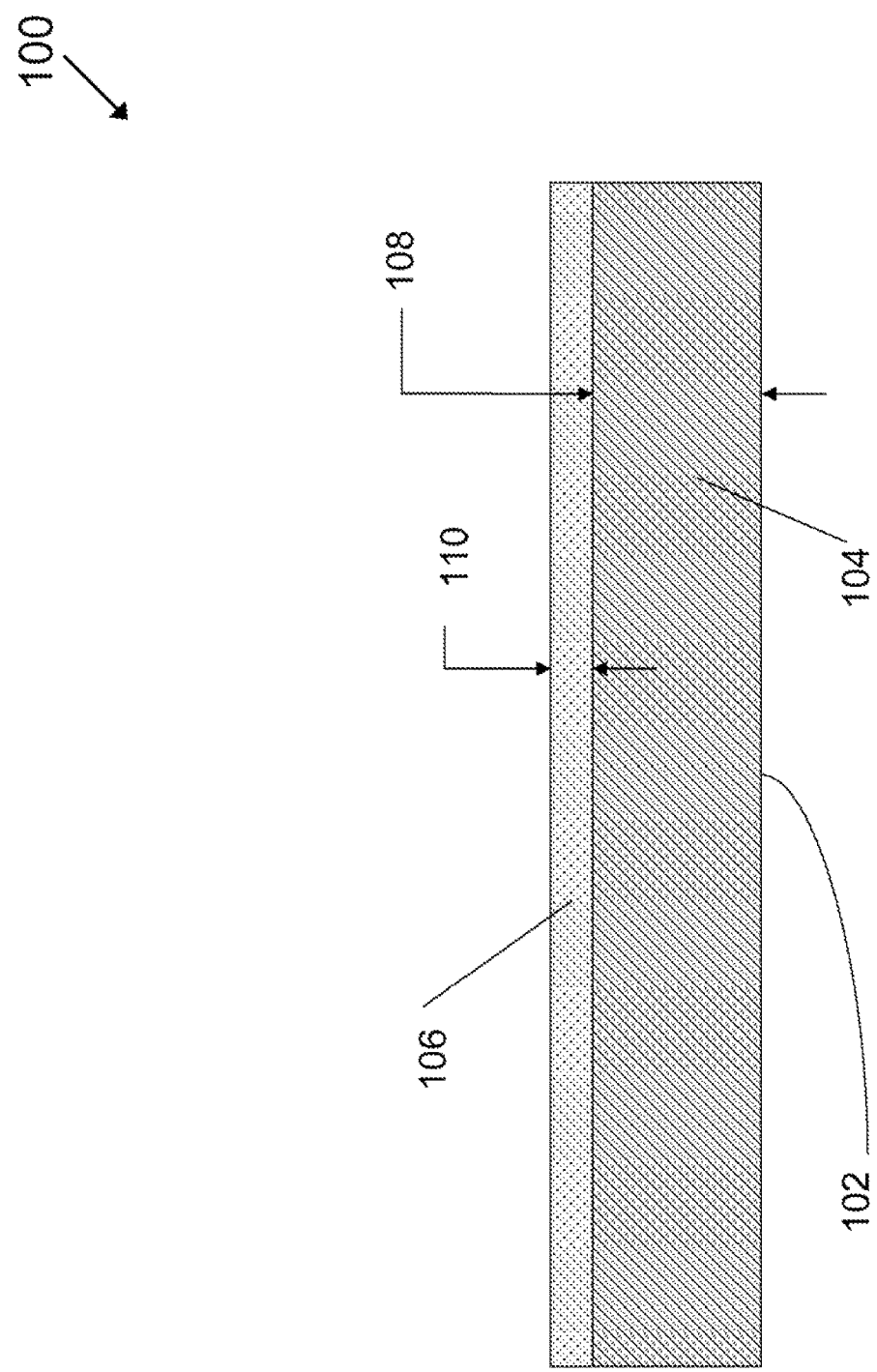

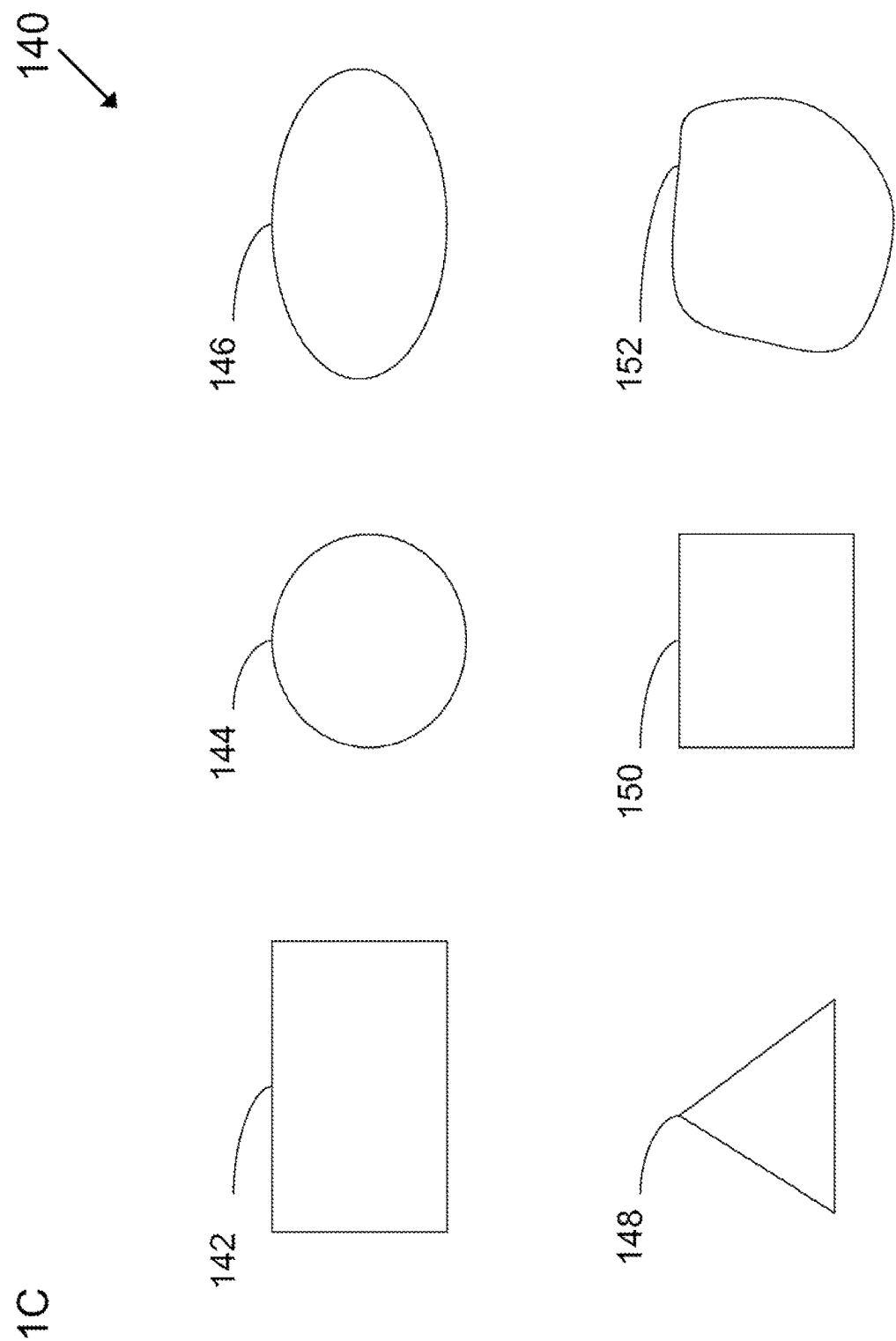

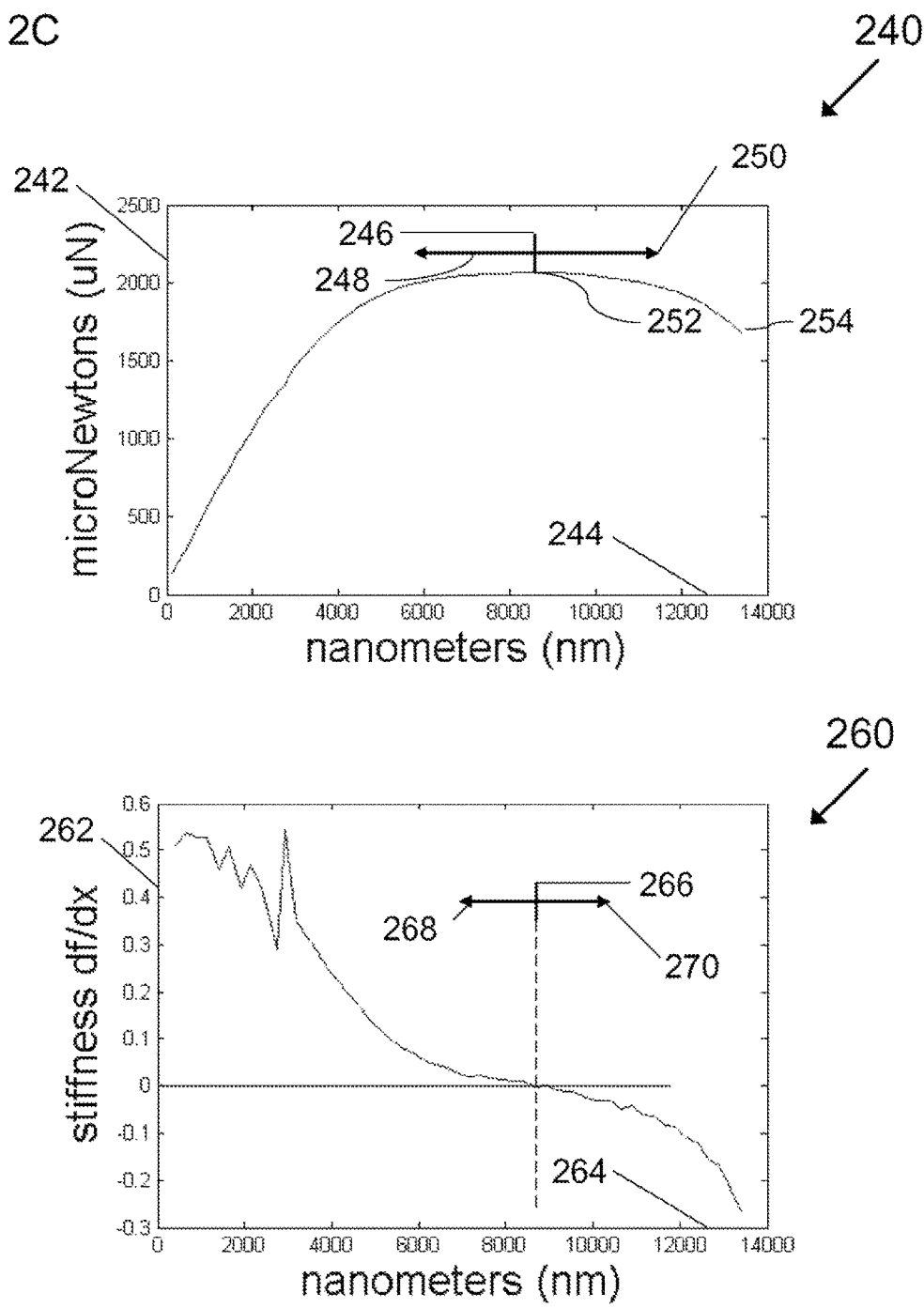

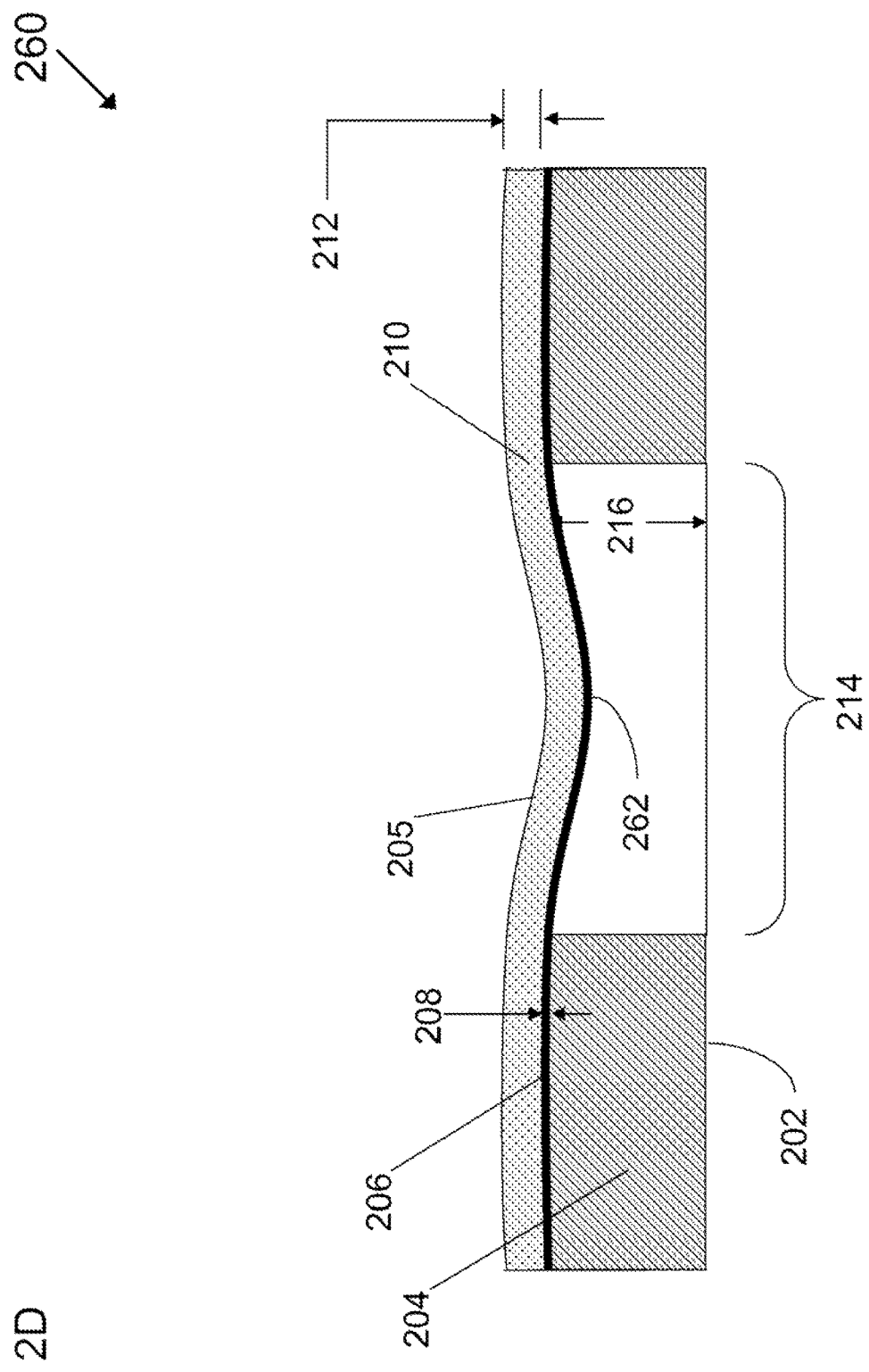

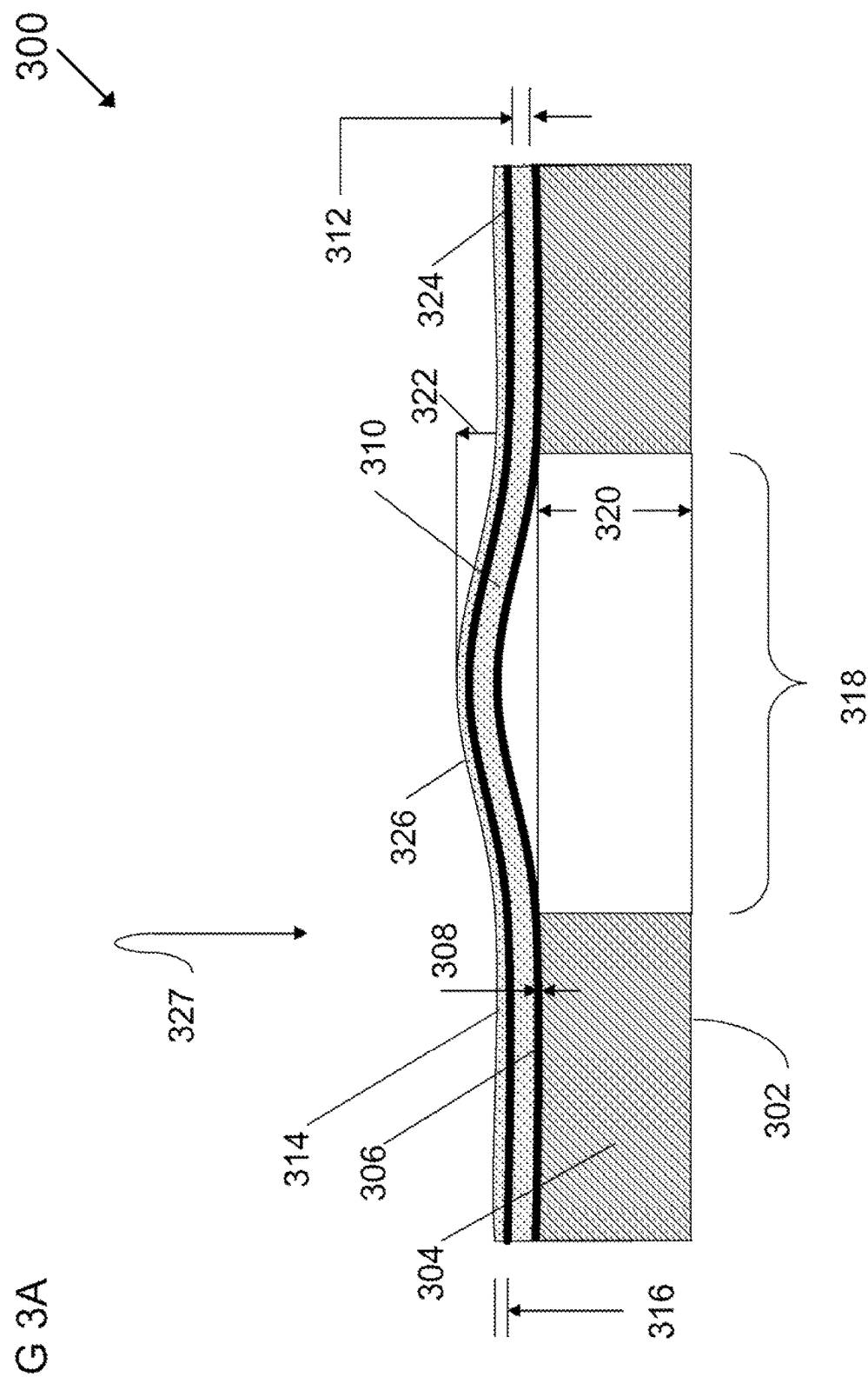

FIG 3B
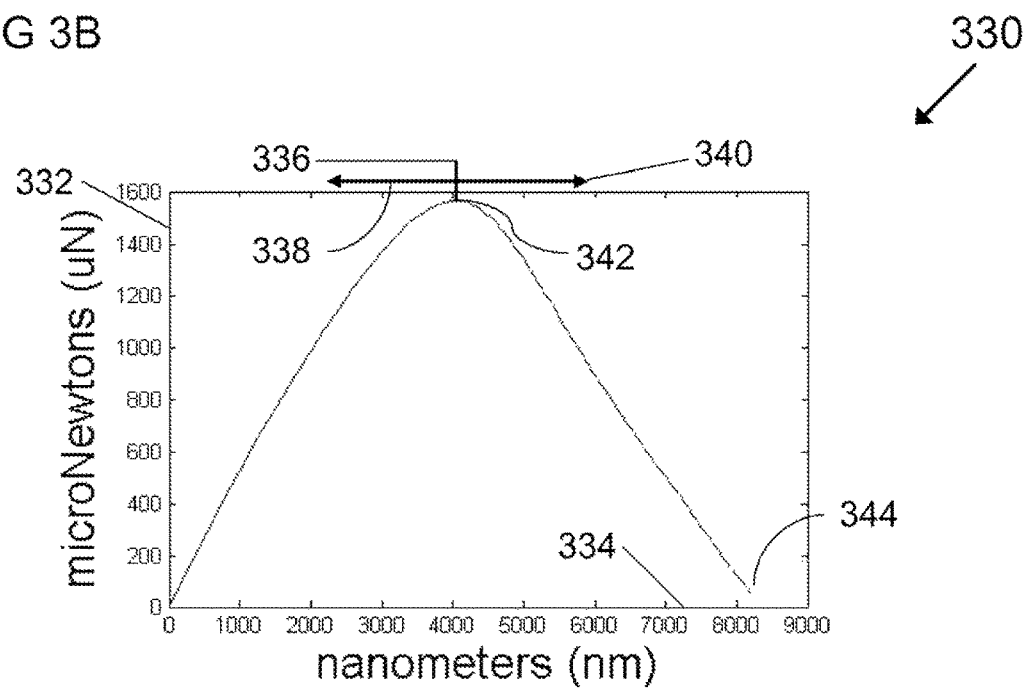
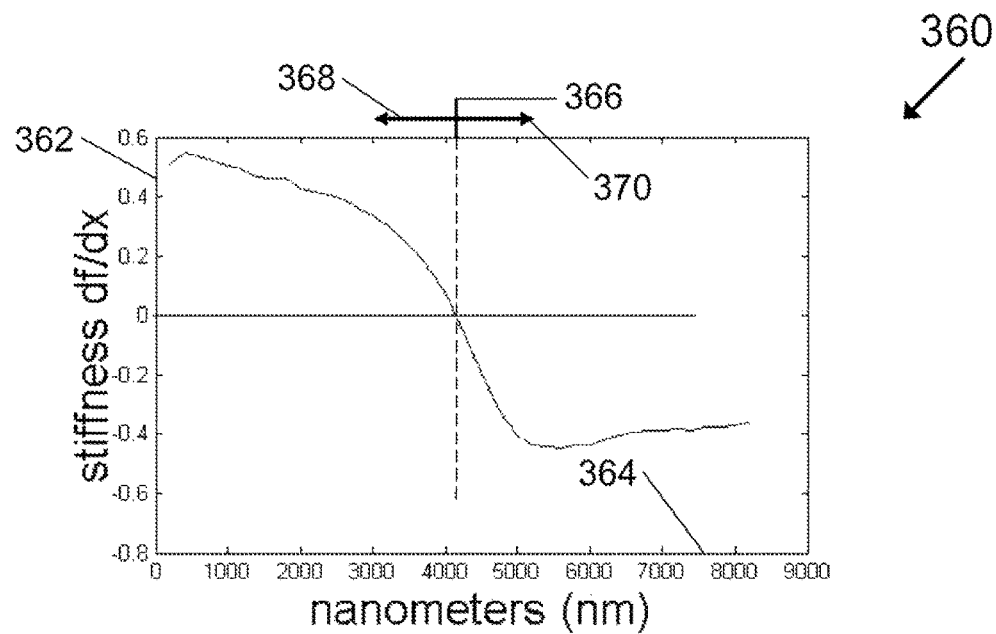

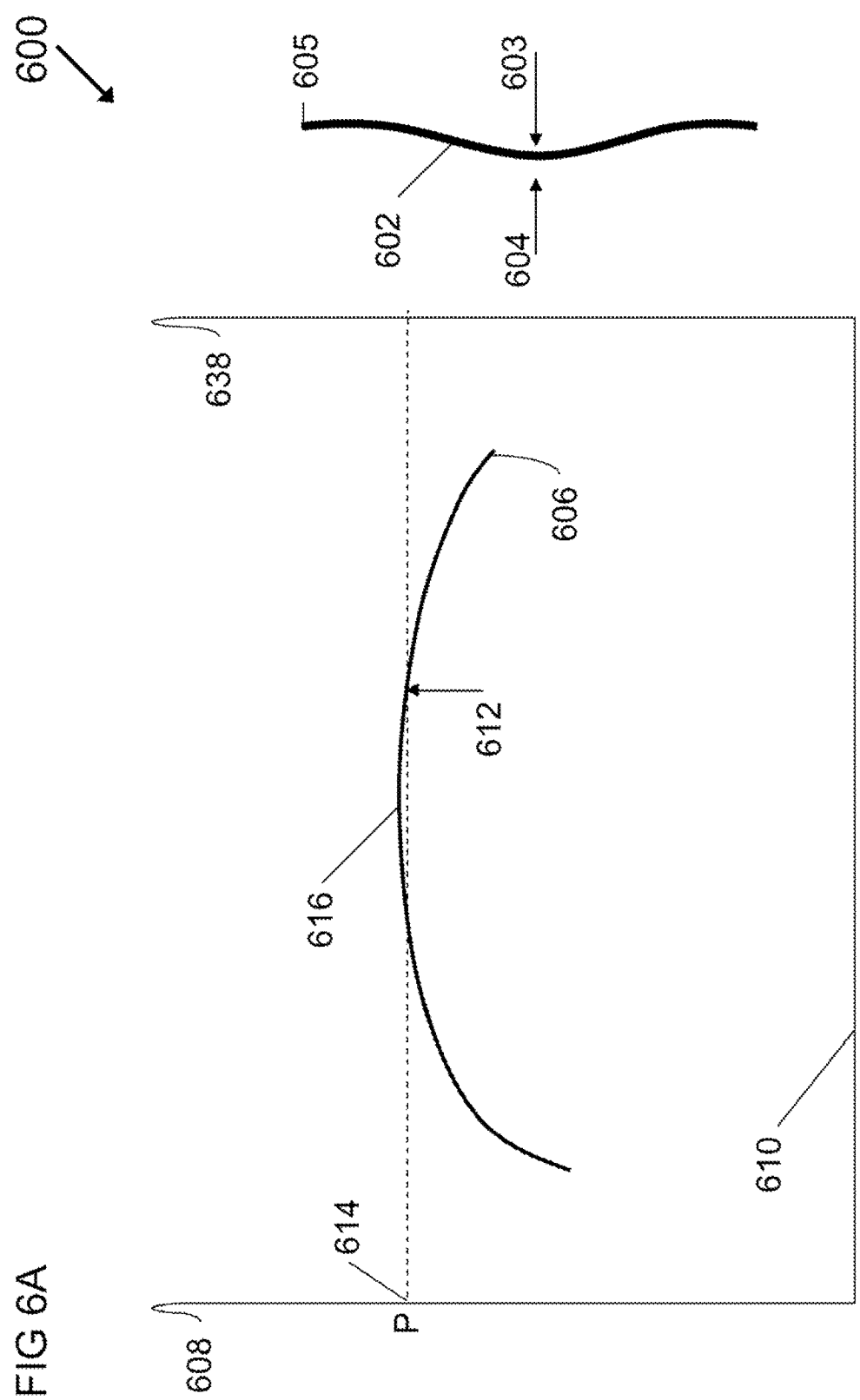

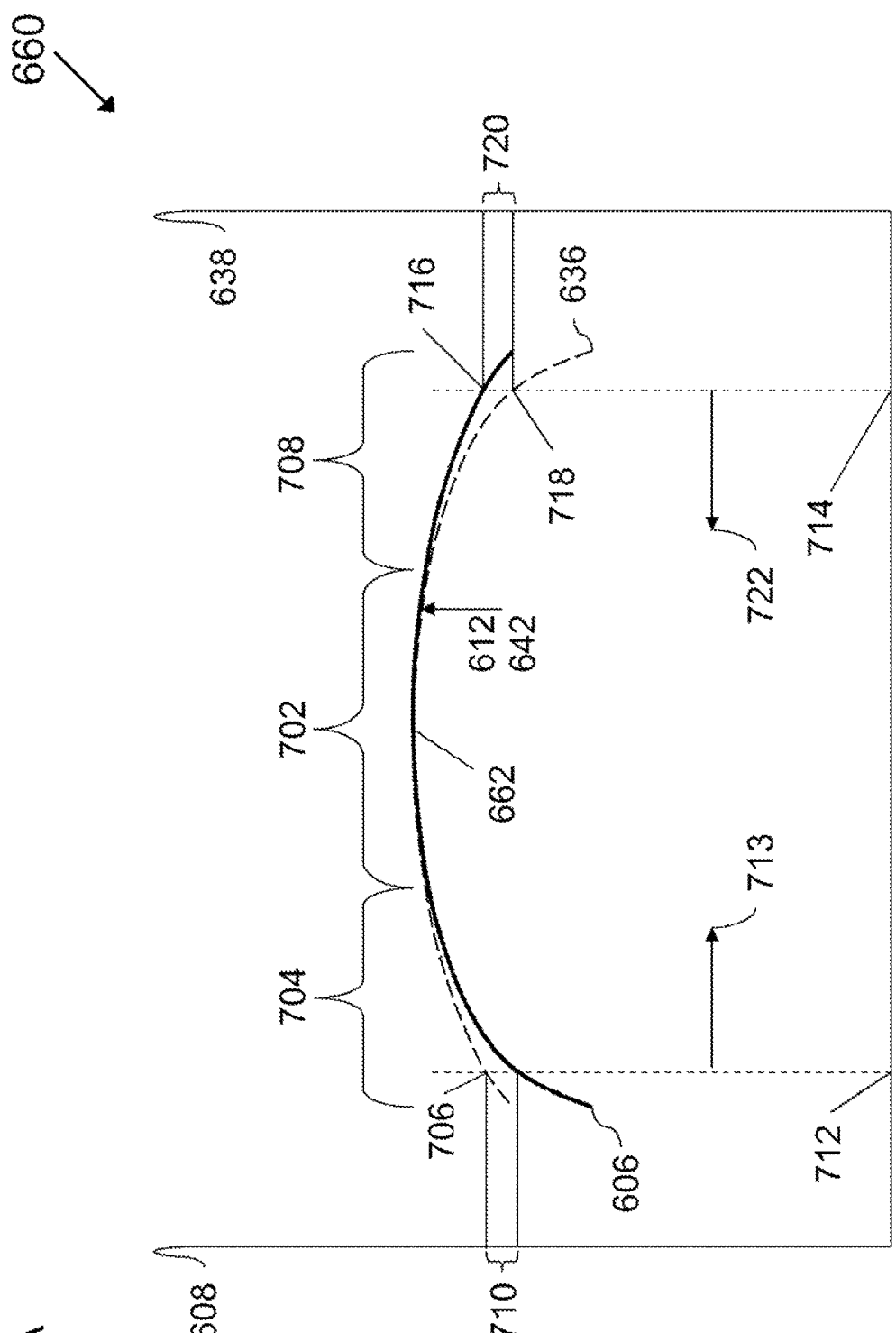

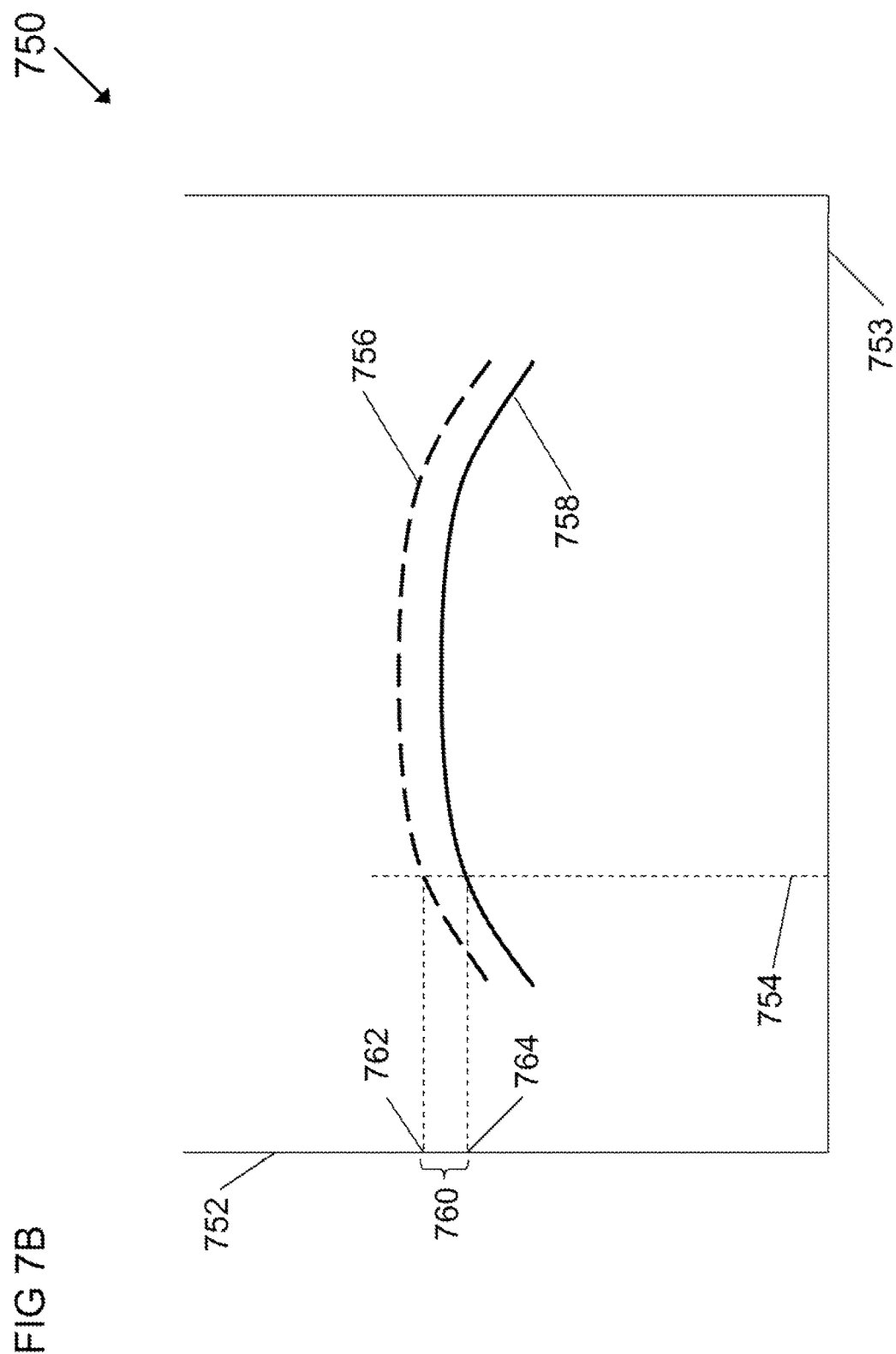

METHOD TO CREATE A REDUCED STIFFNESS MICROSTRUCTURE

RELATED APPLICATIONS

This application is a continuation of U.S. patent application Ser. No. 13/135,424. filed on Jul. 5, 2011.

BACKGROUND OF THE INVENTION

1. Field of Invention

The invention relates generally to micro-electro-mechanical systems (MEMS) and or micro-opto-electro-mechanical systems (MOEMS), and more specifically to apparatuses and methods used to create a MEMS or MOEMS device that utilizes a zero stiffness or near zero stiffness elastic structure.

2. Art Background

Many devices made using MEMS and MOEMS routinely require elements to provide various functionalities, such as stiffness. MEMS and MOEMS elements that provide stiffness have traditionally been obtained from a device that has a positive spring constant or stiffness. Stiffness elements such as; straight beam suspensions, tether wires, meander springs, etc. are used to suspend elements used in MEMS and MOEMS devices. Such stiffness elements are characterized by positive stiffness. Designing elements for MEMS and MOEMS devices using only positive stiffness elements is limiting. All of this can present problems.

Capacitive MEMS switches are designed with a cantilever elastic element that is deflected when a voltage is applied. The large positive stiffness of such devices is required to overcome stiction from the physical stops once the actuation voltage is removed, and to ensure that no amount of signal noise could keep the switch dosed. Actuation voltages on the order of tens of volts is often required, such levels place power demands on the power supply. This can present a problem.

Ohmic MEMS switches also rely on an elastic cantilever element in their design. Ohmic contacts tend to have an increase in stiction over the cycle lifetime of the switch due to plastic deformation of the contact surfaces. In order to develop a switch with a reasonable lifetime, a sufficiently high restoring force must be part of the design. The cantilever that the micro contact is mounted on must have an even greater stiffness than the capacitive MEMS switch, thus requiring an even larger actuation voltage. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 1A illustrates a cross-sectional view of a multilayer microstructure, according to embodiments of the invention.

FIG. 1C illustrates various projected areas of buckling layers within a microstructure, according to embodiments of the invention.

FIG. 2C illustrates a force displacement curve for a multi-zone microstructure spring, according to embodiments of the invention.

FIG. 2D illustrates a second stable state of a buckled membrane multi-zone microstructure spring, according to embodiments of the invention.

FIG. 3A illustrates a cross-sectional view of a buckled multi-layered membrane within a microstructure, according to embodiments of the invention.

FIG. 3B illustrates a force displacement curve for a multi-zone microstructure spring, according to additional embodiments of the invention.

FIG. 6A illustrates a force-displacement characteristic of a first buckled membrane, according to embodiments of the invention.

FIG. 7A illustrates an operating zone of a reduced stiffness elastic micro-mechanical structure, according to embodiments of the invention.

FIG. 7B illustrates another operating zone of a reduced stiffness elastic micro-mechanical structure, according to embodiments of the invention.

DETAILED DESCRIPTION

Figure 1B:
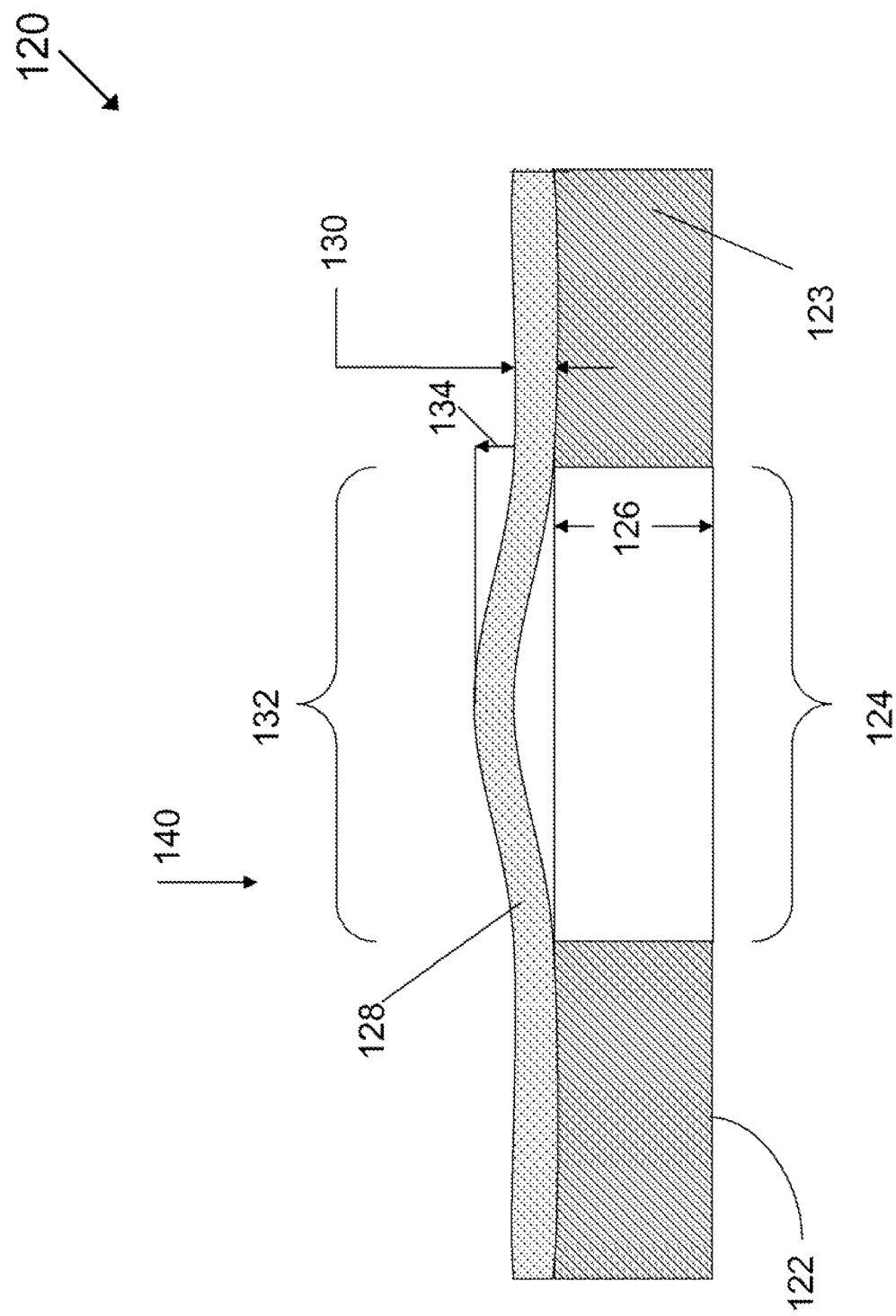
FIG. 1B illustrates a cross-sectional view of a buckled layer within a microstructure, according to embodiments of the invention.

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for creating a zero stiffness micro-mechanical structure. In one or more embodiments, a structure with zero stiffness or near zero stiffness is created from a pair of buckled membranes on a microstructure. In other embodiments a reduced stiffness micro-mechanical structure is created from a pair of buckled membranes where the stiffness of the composite structure is a fraction of the stiffness of either individual buckled membrane.

In various embodiments, a reduced stiffness microstructure (RSM) is created from a pair of multi-zoned microstructure springs as described in this description of embodiments. As used in this description of embodiments, both zero-stiffness micro-mechanical structures and reduced stiffness micro-mechanical structures are included in the term RSM. The RSM can be used with micro-electro-mechanical systems (MEMS) devices and/or micro-opto-electro-mechanical systems (MOEMS) devices, or user defined devices that can incorporate aspects of both MEMS and MOEMS devices. Embodiments of the invention are not limited by the type of device used in conjunction therewith and those of skill in the art will recognize that a device can be user defined and embodiments of the invention can be used with devices that do not yet exist. Embodiments of the invention are not limited by the device used therewith. A non-limiting list of devices includes: gyroscopes, inertial sensors, gravitational sensors, accelerometers, seismic sensors, high-G sensors, pressure sensors, mirrors, tunable focal point mirrors, interferometric modulator displays, optical switches, optical cross connects, tunable lasers, switches, capacitive MEMS switches, ohmic MEMS switches, etc.

In all of the figures contained in this description of embodiments, geometrical elements are presented to illustrate concepts and parts of various microstructures. In so doing, geometrical elements such as: thickness, lengths, displacements, and shapes are shown which are not to scale. These geometrical elements have been chosen to facilitate understanding within the confines of the paper on which the illustrations are presented; therefore, relative proportions and absolute dimensions should not be inferred therefrom. Additionally, in the figures that follow, a finite horizontal extent of substrates and layers is shown such that only a single buckled membrane or a pair of opposing buckled membranes is illustrated in any given figure. Those of skill in the art will recognize that the substrates can extend horizontally to encompass many buckled membranes on a single substrate. No limitation is intended, and the finite extent of the substrate and buckled membranes is intended to preserve clarity in the illustrations.

FIG. 1A illustrates, generally at 100, a cross-sectional view of a multilayered microstructure, according to embodiments of the invention. With reference to FIG. 1A, the multi-layered microstructure 102 has a substrate 104, with a thickness indicated at 108. The substrate 104 can be made from a semiconductor material such as silicon. A buckling layer is illustrated at 106, with a thickness indicated at 110. In the view shown in 100, the buckling layer 106 has not released from the substrate 104. The buckling layer 106 can be made of a variety of materials such as silicon dioxide, silicon nitride, etc. selected such that buckling is promoted in the final structure after processing.

In one or more embodiments, the buckling layer 106 can be made from a plurality of layers (sub-layers), as described below in the figures that follow, or the buckling layer can be a monolayer. An important property of the materials selected for the buckling layer and the substrate is that a compressive stress should be developed in the buckling layer relative to the substrate. This is accomplished by different methods in various embodiments, and in some embodiments it is accomplished by arranging for the coefficient of thermal expansion of the buckling layer to be less than the coefficient of thermal expansion of the substrate. Or in the case of a multilayered buckling layer, at least one layer of the sub-layers has a coefficient of thermal expansion that is less than the coefficient of thermal expansion of the substrate.

The buckling layer and its sub-layers can be prepared from an inorganic material such as silicon, silicon dioxide in any of its forms (monocrystalline, polycrystalline, microcrystalline or amorphous) silicon germanium, silicon nitride, silicon carbide, diamond, carbon, titanium nitrite, a metallic material such as for example, titanium, gold, copper, aluminum, or alloys thereof, an organic material such as for example, a photosensitive resin such as benzocyclobutene (BCB), parylene, polydimethylsiloxane (PDMS), polyethylene terephthalate (PET), poly-para-xylylene, etc. The buckling layer can be made by any known means or by yet unknown means, the exact way in which the buckling layer is made does not limit embodiments of the invention.

Some non-limiting examples of how a buckling layer can be formed by means known to those of skill in the art are, but are not limited to; thin film deposition, film lamination, spin definition, spraying organic materials, ion implantation, etc. Thin film deposition can be performed by chemical vapor deposition (CVD), low pressure chemical vapor deposition (LPCVD), plasma enhanced chemical vapor deposition (PECVD), physical vapor deposition (PVD), electrolysis, epitaxy, thermal oxidation, and vacuum deposition.

FIG. 1B illustrates, generally at 120, a cross-sectional view of a buckled layer within a microstructure, according to embodiments of the invention. With reference to FIG. 1B, a microstructure 122 has a substrate 123 and a buckling layer 128. A region having a width indicated by 124 is patterned and etched to a depth shown as 126. Removal of substrate 123, from the region 124, causes buckling layer 128 to release from a flat planar orientation as illustrated by 106 (FIG. 1A) to the curved shape as illustrated by 128 (FIG. 1B) The buckling layer 128 develops a maximum displaced height indicated by 134. The buckling layer 128 has a horizontal extent indicated by 132. Note that the horizontal extent 132 can be less than the extent of the region 124. The relationship between the horizontal extent 132 and the region 124 depends on the thickness of the buckling layer, the material properties, the magnitude of the compressive stress, and the dimensions and geometry of the projected shape of a buckling laver. In one non-limiting example, a horizontal extent 132 (850 μm) was 85% of the length of the region 124 (1000 μm). A top view 140 of the buckling layer 128 is illustrated in 140 (FIG. 1C) for a variety of projected shapes.

FIG. 1C illustrates, generally at 140, various projected areas of buckling layers within a microstructure, according to embodiments of the invention. With reference to FIG. 1C, a released buckled shape can have any type of projected area. The shape of the projected area depends on the patterning that was employed in order to release a buckling layer over an area. A rectangular shape is indicated at 142, a round shape is indicated at 144, and an oval shape is indicated at 146. A triangular shape is indicated at 148, a square shape is indicated at 150, and a general user defined shape is indicated at 152.

Figure 2A:
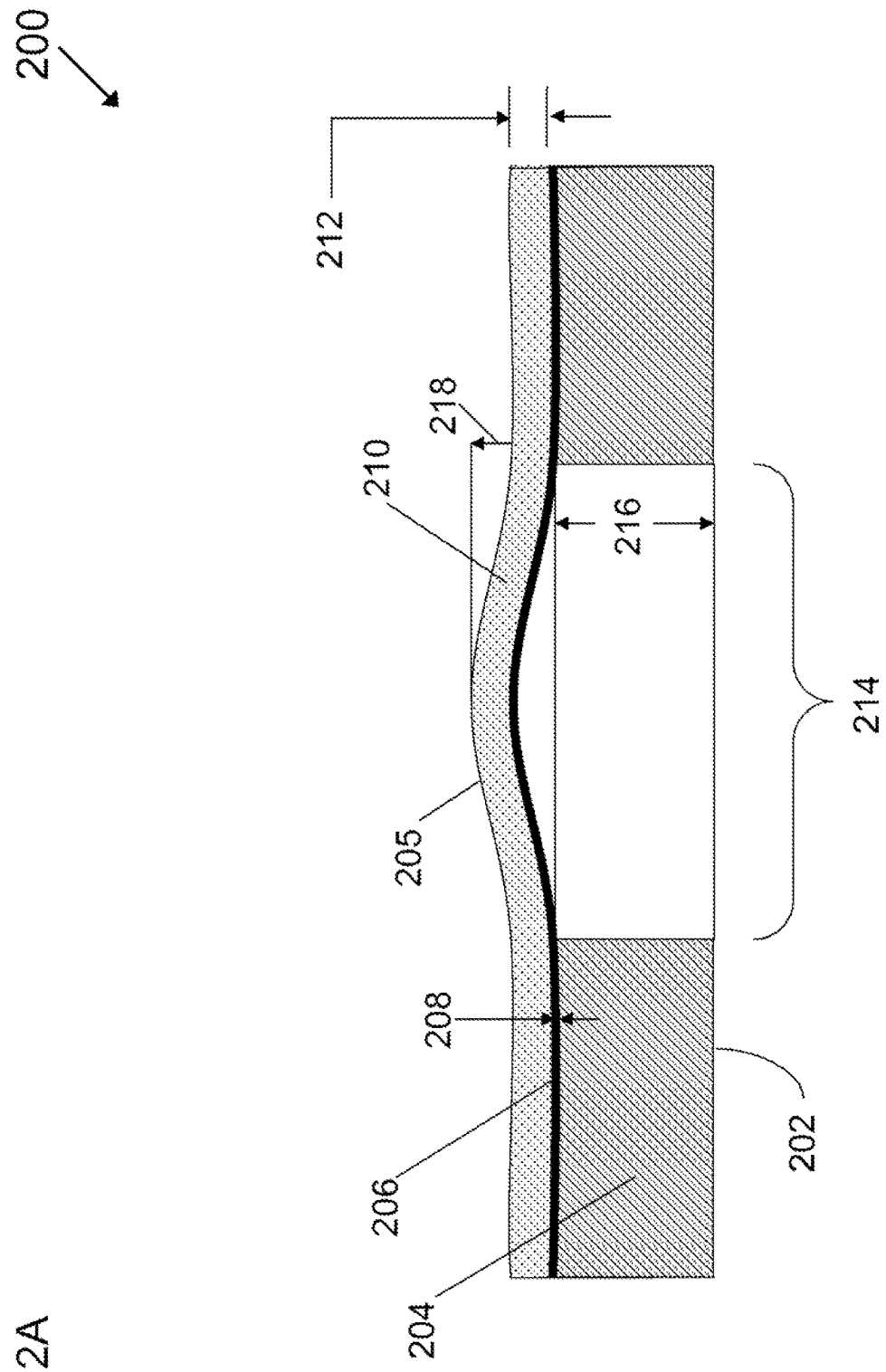
FIG. 2A illustrates a cross-sectional view of a multilayer buckling layer within a microstructure, according to embodiments of the invention

FIG. 2A illustrates, generally at 200, a cross-sectional view of a multilayer buckling layer within a microstructure, according to embodiments of the invention. In one embodiment, a silicon-on-insulator (SOI) wafer 202 was patterned to create a matrix of buckled membranes (only one is shown in the figure for clarity). In this example, an N-type silicon substrate 204 has a thickness of 400 micrometer (μm) indicated at 216. A silicon dioxide layer 206, having a thickness 208 of 2 μm was thermally grown on a top layer 210 also referred to as a device layer having a thickness 212 of 5 μm and made from the same material as the substrate 204 and then sandwiched between the substrate 204 and device layer 210. The bottom of the substrate was patterned over an area 214 and etched to a depth of 400 μm, thereby removing the substrate from beneath the silicon dioxide layer 206.

Various methods can be used to etch the substrate 204. For example, a layer of silicon dioxide (not shown for clarity) was deposited on the bottom of the wafer 202 followed by a layer of photo resist (also not shown for clarity). The photo resist was then lithographically patterned and developed using standard micromachining techniques. A Buffered Oxide Etch was then used to etch through the silicon dioxide layer and then Deep Reactive Ion Etching (DRIE) was used to remove silicon selectively from beneath the silicon dioxide layer 206. Other techniques can be used such as an anisotropic wet etch using Tetramethylammonium Hydroxide (TMAH). Other micromachining techniques can be used; embodiments of the invention are not limited by the choice of micromachining techniques.

After removal of the substrate 204, over the area 214, the silicon doxide/device layer 206/210 releases to form a buckling layer 205 with two sub-layers. This is the first of two stable states for the buckling layer. The other or second stable state is referred to as a "popped through" position and is as illustrated below in FIG. 2D. In this example, the resulting buckled membrane 205 had a projected area which was square in shape with dimensions of 1 millimeter (mm) on edge. A resulting maximum deflected height 218 is approximately 15 μm.

Figure 2B:
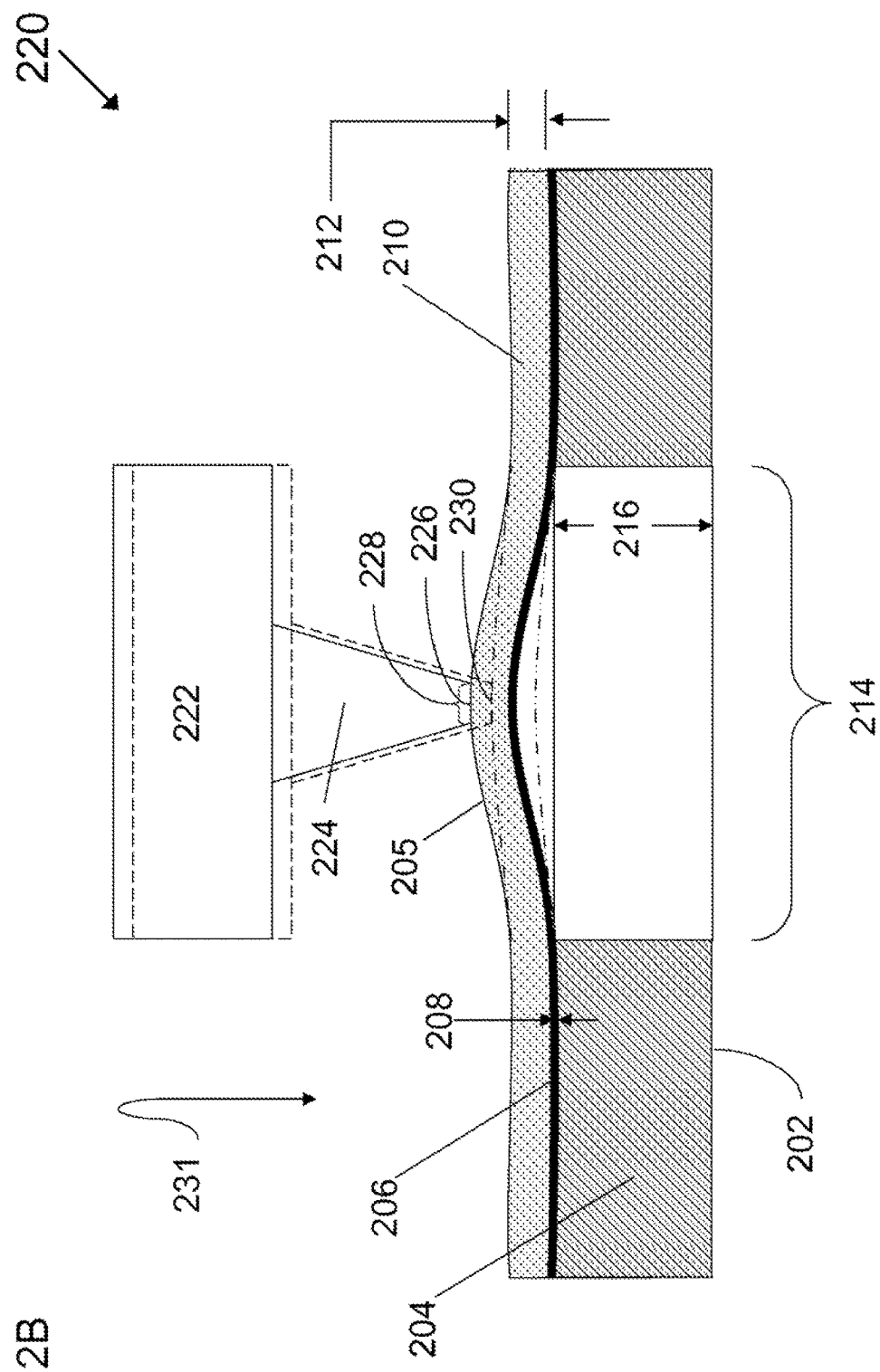
FIG. 2B illustrates contacting a buckled microstructure membrane with a pseudo point load, according to embodiments of the invention.

FIG. 2B illustrates, generally at 220, contacting a buckled microstructure membrane with a pseudo point load, according to embodiments of the invention. Referring to FIG. 2B, a calibrated micro Newton (μN) force sensor 222 is used to apply a pseudo point load to the buckled membrane 205 over a contact area 226. In the experiment resulting in the measurement shown below in FIG. 2C, a force sensor from Femto Tools model FT-S270 was used. This force sensor, mounted to a piezoelectric actuator with a translation range of 20 μm, is capable of applying loads in the micro Newton range (μN). Force sensor 222 has an actuator 224. The actuator 224 has a contact pad 228 which applies the load to the buckled membrane 205 over the contact area 226. The contact area 226 is the portion of the buckled membrane 205 that is directly under the contact pad 228. The contact area 226 is much smaller than the surface area of the buckled membrane 205. The dimensions of the contact pad are 50 μm by 50 μm. It is important to note that the force sensor 222 and the actuator 224 are used to apply a controlled displacement (along with a corresponding application of force) to the buckled membrane 205. The controlled displacement is used to determine a load the buckled membrane applies in response to the controlled displacement. The methods described above provide an ability to characterize the physical behavior of a MEMS structure or a MOEMS structure which is superior to exposing the entire surface of such structures to a uniform load through for example pressure exerted by a fluid or a gas.

During the measurement procedure that resulted in the measurement presented in FIG. 2C, the force sensor actuator 224 (FIG. 2B) applies a load to the buckled membrane 205, which causes the buckled membrane 205 to translate in the direction indicated by an arrow 231. One such subsequent position associated with the translation of the actuator 224 and the buckled membrane 205 is illustrated by the dashed lines indicating the displaced position of the actuator and membrane and a point 230. The point 230 shows the location of the actuator tip-buckled membrane interface at one point during the measurement procedure. Following the procedure of applying an increasing displacement to the buckled membrane 205 the measured force verses displacement curve reveals a multi-zoned spring as illustrated in FIG. 2C. This multi-zoned spring has a force-displacement characteristic which corresponds to a stiffness profile which is initially positive, transitions through zero and then becomes negative. Further application of force results in a large deflection of the buckled membrane to a second stable state with curvature that is opposite that of the first stable state. The second stable state is illustrated below in conjunction with FIG. 2D.

FIG. 2C illustrates, generally at 240, a force-displacement characteristic for the multi-zone microstructure spring of FIG. 2A and FIG. 2B, and a corresponding stiffness-displacement relationship, generally at 260, according to embodiments of the invention. With reference to FIG. 2C and 240, force is plotted on the vertical axis 242 in micro Newtons (μN) and displacement is plotted on the horizontal axis 244 in nanometers. A corresponding stiffness-displacement relationship is plotted in 260 with stiffness plotted on the vertical axis 262 with units of kiloNewtons/meter and displacement plotted on the horizontal axis 264 with units of nanometers. The force-displacement characteristic 240 reveals a multi-zone microstructure spring, characterized by three zones.

A first zone, indicated by 248 and 268, the positive stiffness zone, is characterized by increasing force with increasing displacement of the buckled membrane. A second zone, indicated by, 246 and 266, the zero stiffness zone, is characterized by a constant force-displacement condition. A third zone 250 and 270, the negative stiffness zone, is characterized by decreasing force with increasing displacement. As used in this description of embodiments, the term "zone" can imply a point or a region. The extent or lack of extent of a "zone" is determined by the particular physical structure. As such, in some cases, the zero stiffness zone will exist as a point. No limitation is implied by the use of the term "zone" to characterize the physics of the multi-zone microstructure spring.

When the buckled membrane passes a displacement illustrated at 254, the buckled membrane quickly translates away from the force sensor actuator 224 to assume its second stable state as shown at 262 in FIG. 2D.

FIG. 3A illustrates, generally at 300, a cross-sectional view of a buckled multi-layered membrane within a microstructure, according to embodiments of the invention. Similar to the microstructure of FIG. 2A, in one embodiment, a silicon-on-insulator (SOI) wafer 302 was patterned to create a matrix of buckled membranes. In this example, an N-type silicon substrate 304 has a thickness of 400 micrometer (μm) indicated at 320. A silicon dioxide layer 306, having a thickness 308 of 2 μm was thermally grown and sandwiched between the substrate 304 and a layer 310. The layer 310 has a thickness 312 of 5 μm and is made from the same material as the substrate 204. Next a 500 angstrom thick titanium layer 324 was evaporated to the silicon layer 310. A 3000 angstrom thick gold layer was evaporated on top of the titanium layer. The bottom of the substrate was patterned over an area 318 and etched to a depth of 400 μm; thereby removing the substrate from beneath the silicon dioxide layer 306.

Similar to the etching applied to the microstructure of FIG. 2A, various methods can be used to etch the substrate 304, prior to release se of a buckling layer 326. For example, a layer of silicon dioxide (not shown for clarity) was deposited on the bottom of the wafer 302 followed by a layer of photo resist (also not shown for clarity). The photo resist was then lithographically patterned and developed using standard micromachining techniques. A Buffered Oxide etch was then used to etch through the silicon dioxide layer and then Deep Reactive Ion Etching (DRIE) was used to remove silicon selectively from beneath the silicon dioxide layer 306. Other techniques can be used such as an anisotropic wet etch using Tetramethylammonium Hydroxide (TMAH). Other micromachining techniques can be used as well; embodiments of the invention are not limited by the choice of micromachining techniques.

After removal of the substrate 304, over the area 318, the buckling layer 326 (which includes layers 306, 310, 324, and 314) releases to form a buckling layer 326 having four sub-layers. In this example, the resulting buckled membrane 326 has a projected area which was square in shape with dimensions of 1 millimeter (mm) on edge, with a predominantly circular curved shape buckling out of the horizontal plane of the substrate. A resulting maximum deflected height 322 is approximately 10 μm.

During the measurement procedure that resulted in FIG. 3B, the force sensor actuator 224 (shown in FIG. 2B but not shown in FIG. 3A for clarity) applies a load to the buckled membrane 326 (FIG. 3A) which causes the membrane to translate in the direction indicated by an arrow 327 (FIG. 3A). As described above in conjunction with FIG. 2B, the procedure results in force and displacement being recorded as the buckled membrane is translated by application of the pseudo point load applied by the force transducer actuator. Subsequent positions associated with the translation of the buckled membrane and the force transducer actuator are not shown for clarity. The procedure applied to the buckled membrane 326 reveals a multi-zoned spring as illustrated in FIG. 3B. This multi-zoned spring has a force-displacement characteristic which corresponds to a stiffness profile which is initially positive, transitions to zero and then becomes negative. Further application of force results in a large deflection of the buckled membrane to a second stable state with curvature that is opposite that of the first stable state.

FIG. 3B illustrates, generally at 330, a force-displacement characteristic for the multi-zone microstructure spring of FIG. 3A, and a corresponding stiffness-displacement relationship, generally at 360, according to embodiments of the invention. With reference to FIG. 3B at 330, force is plotted on the vertical axis 332 with units of micro Newtons (μN) and displacement is plotted on the horizontal axis 334 with units of nanometers. A corresponding stiffness-displacement relationship is plotted in 360 with stiffness plotted on the vertical axis 362 with units of kiloNewtons/meter and displacement plotted on the horizontal axis 364 with units of nanometers. The force-displacement characteristic 330 reveals a multi-zone microstructure spring characterized by three zones.

A first zone indicated by 338 and 368, the positive stiffness zone, is marked by increasing force with increasing displacement of the buckled membrane. A second zone indicated by 336 and 366, the zero stiffness zone, is characterized by a constant force-displacement condition. A third zone 340 and 370, the negative stiffness zone, is characterized by decreasing force with increasing displacement. The zero stiffness zone 336/366 can be a point or a region. No limitation is implied by the use of the term "zone" to characterize the physics of the microstructure spring.

When the displacement of the buckled membrane approaches the end of the negative stiffness zone, as indicated by 344, the buckled membrane quickly translates away from the force sensor actuator 224 to assume its second stable state which is qualitatively shown at 262 in FIG. 2D.

The addition of the metal layers, i.e., 500 angstroms of titanium 324 and 3000 angstroms of gold 314 has increased the linearity of both the positive stiffness zone and the negative stiffness zone as illustrated by the measurements presented in FIG. 3B. In various embodiments, a substantially linearized negative stiffness spring is obtained from a buckled membrane within a microstructure. Such devices have three zones for operation, which are selectable based on an initial displacement from a rest position of the buckled membrane.

Figure 4:
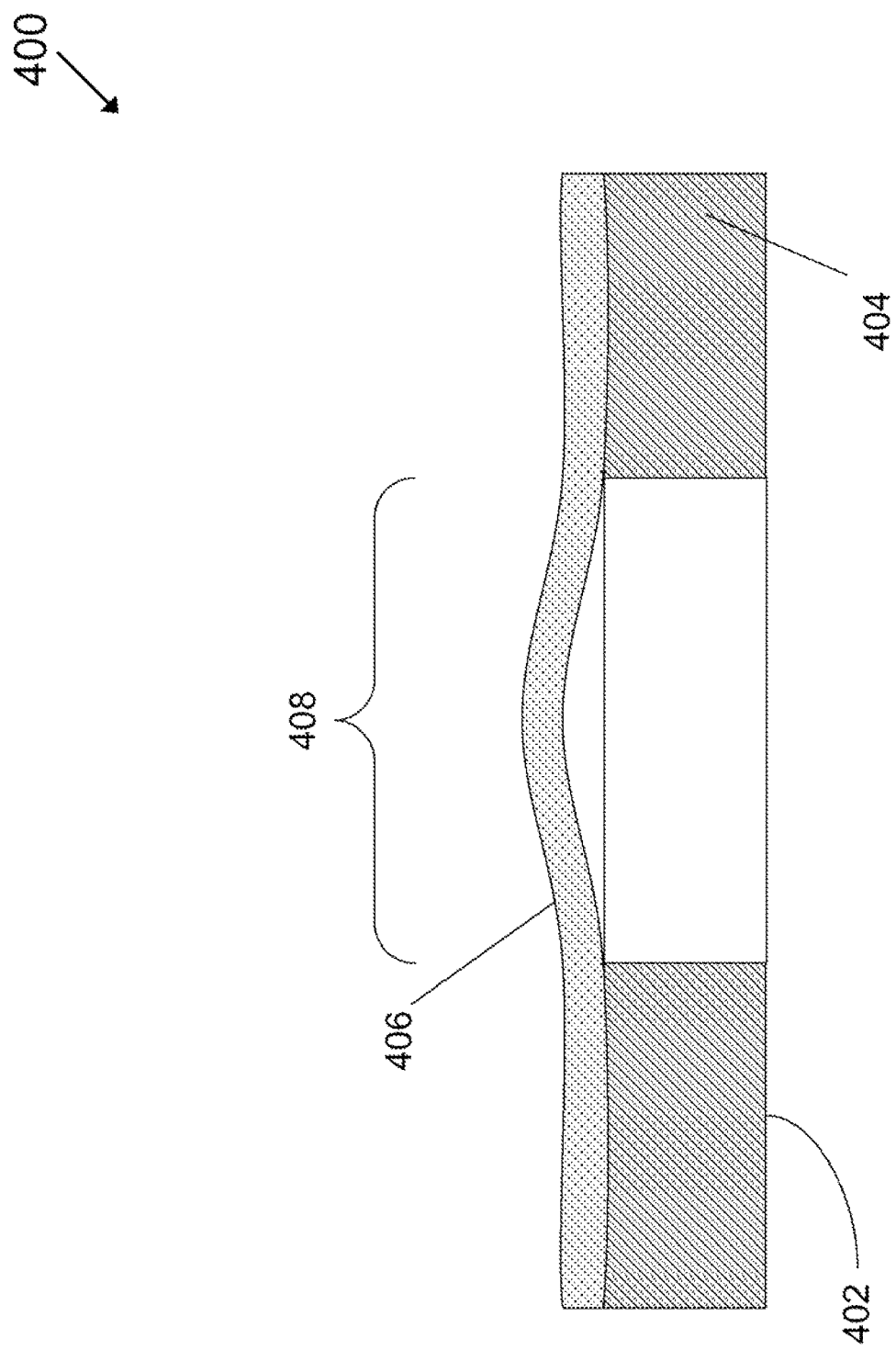
FIG. 4 illustrates a cross-sectional view of a buckled layer within a microstructure, according to additional embodiments of the invention.

FIG. 4 illustrates, generally at 400, a cross-sectional view of a buckled layer (buckled membrane) within a microstructure, according to additional embodiments of the invention. With reference to FIG. 4 buckling of a layer can be obtained by localized ion implantation into the layer. Ions implanted during ion implantation induce a compressive stress in the buckling layer. The compressive stress induces buckling, which results in a release of a buckling layer into a curved shape that functions as a multi-zoned microstructure spring. The magnitude of the compressive stress induced in the layer depends on the dose selected and the types of ions used. Heat treatment can be applied at approximately 200 degrees C. to trigger release of the buckling layer 406 shows the buckling layer after release into a curved shape. Note that the buckling layer 406 and the substrate 404 can be the same material; different coefficients of thermal expansion within layers is not required in order to release a buckling layer via on implantation. Thus, in the example of FIG. 4 both the substrate and the buckling layer can be made from silicon.

Ion implantation can also be used to release a buckling layer when the buckling layer has a coefficient of thermal expansion that is larger than the coefficient of thermal expansion of the substrate. Formation of a layer with a coefficient of thermal expansion which was larger than the coefficient of thermal expansion of the substrate would not result in release of the buckling layer since the buckling layer would be in a state of tension. Ion implantation is used to overcome the state of tension and to create a state of compression, which will result in release of the buckling layer.

Note that the state of tension or compression within a buckling layer of a microstructure depends on, in general: the coefficients of thermal expansion of the materials (e.g., individual; layers of the microstructure), the formation temperature of the microstructure, and the operating temperature of the microstructure. For example, a buckling layer that is in a state of tension at 20 degrees Centigrade will buckle at a temperature above 20 degrees Centigrade (e.g., 200 degrees Centigrade) since the buckling layer will expand more than the substrate (assuming a coefficient of thermal expansion of the buckling layer is larger than a coefficient of thermal expansion of the substrate). Therefore, materials, coefficients of thermal expansion, operating temperatures, and process steps, e.g., ion implantation are considered when buckling is desired within a microstructure.

Many variations in microstructures can exist and many different materials can be used for the substrate and buckling layers. Therefore, depending on the material used for the substrate and the material used for the desired buckling layer, the species to be implanted via ion impanation will be selected to achieve appropriate compressive stress within the material's lattice structure.

An example of a buckling layer having a coefficient of thermal expansion that is greater than the coefficient of thermal expansion of a substrate is a buckling layer made from silicon nitride $Si_3N_4$, having a coefficient of thermal expansion of $3.4 \times 10\text{-}6$ mm/k which can be released from a substrate of silicon having a coefficient of thermal expansion of $2.6 \times 10\text{-}6$ mm/K via ion implantation. Similarly, a buckling layer can be made from alumina $Al_2O_3$ and can be released from a silicon substrate.

Figure 5:
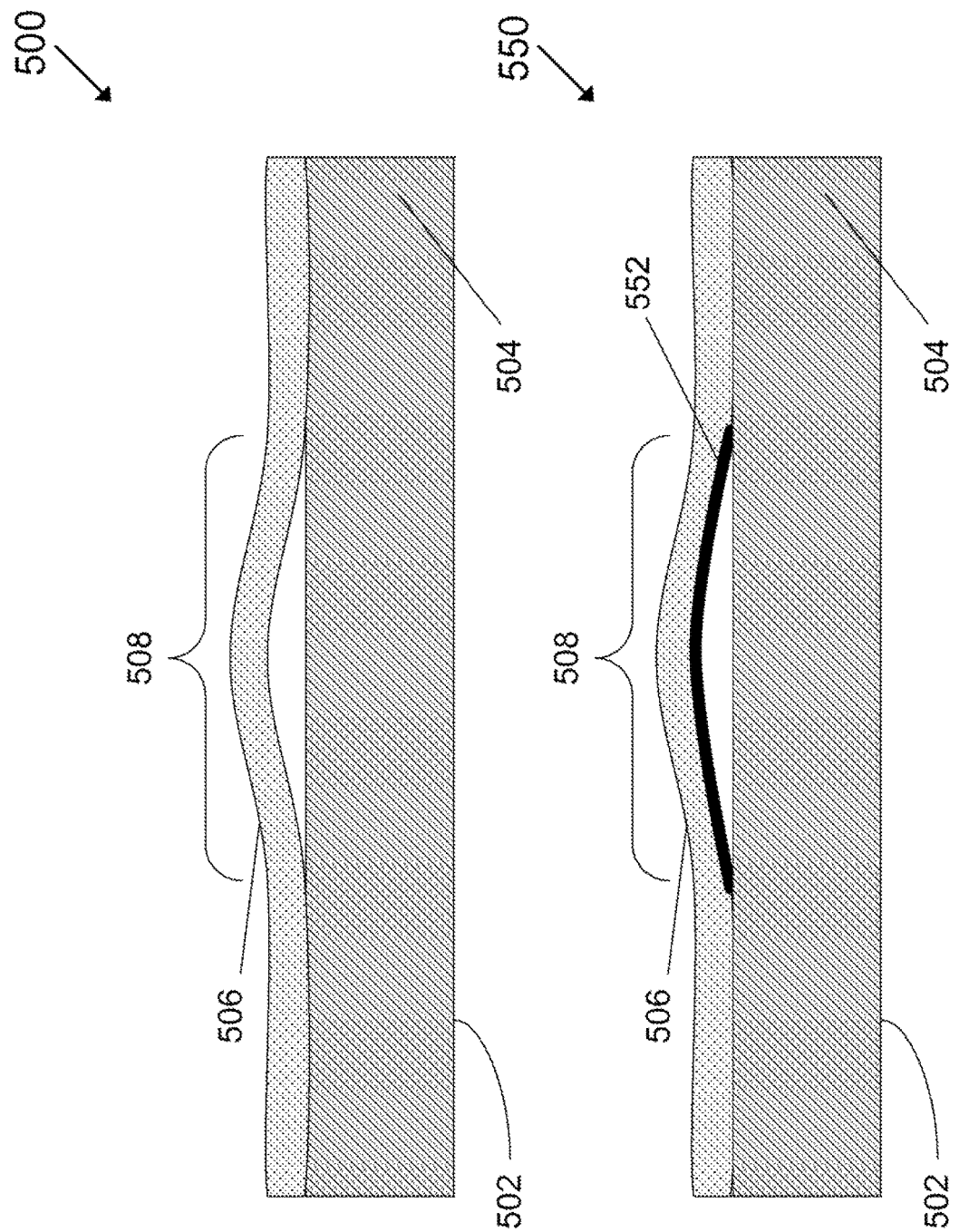
FIG. 5 illustrates a cross-sectional view of a buckled layer within a microstructure, according to additional embodiments of the invention.

FIG. 5 illustrates, generally at 500, a cross-sectional view of a buckled layer within a microstructure, according to additional embodiments of the invention Referring to FIG. 5, a buckling layer 506 is illustrated that has reduced adhesion to a substrate 504 over a region 508. Outside of the region 508, the buckling layer 506 has adhesion sufficient to overcome any differential compressive stress residing within the buckling layer. Adhesion between the buckling layer 506 and 504 over the area 508 is too low to prevent buckling.

Referring to 550 in FIG. 5, release of a buckling layer can be accomplished by application of a first layer that has limited adhesion with the substrate 504, such as a layer 552. In various embodiments, the layer 552 is made from an organic material which provides less adhesion than the adhesion obtained between the buckling layer 506 and the substrate 504. In various embodiments, the layer 552 can be made from polyethylene terephthalate, parylene, benzocyclobutene, etc. For example, a sub-layer of parylene can be deposited by gas spraying on the substrate, patterned by a photolithography step to limit application to the area where release is desired, i.e., 508. Subsequent application of the buckling layer 506 results in limited adhesion under the area 508. Release of the buckling layer can be accomplished by any of the methods previously described, resulting in the buckled membrane 506.

Adhesion between a buckling layer 506 and the substrate 504 can be decreased by a process step(s) in the manufacture of the microstructure for example by an application or a deposition of an intermediate layer (not shown in FIG. 5 at 500), such as by application of liquids e.g., a photosensitive resin such as Unity 2203P from Promerus, LLC.

Depending on the substrate and intended use of the microstructure, buckling can be induced during deposition of a second sub-layer on top of a first sub-layer where the second sub-layer has a high coefficient of thermal expansion than the coefficient of thermal expansion of the first sub-layer. A vacuum heat treatment at 300 degrees C. for several minutes can facilitate release of the buckling layer.

Alternatively, for a liquid sub-layer of propylene carbonate or water, degradation of adhesion can occur from evaporation at temperatures around 100 degrees C., resulting in release of the buckling layer.

FIGS. 1A-5 above and the discussion directed to them describe various methods of creating a buckled membrane on a microstructure. In various embodiments, a reduced stiffness microstructure (RSM) is made from two opposing buckled membranes with tailored properties.

Figure 6B:
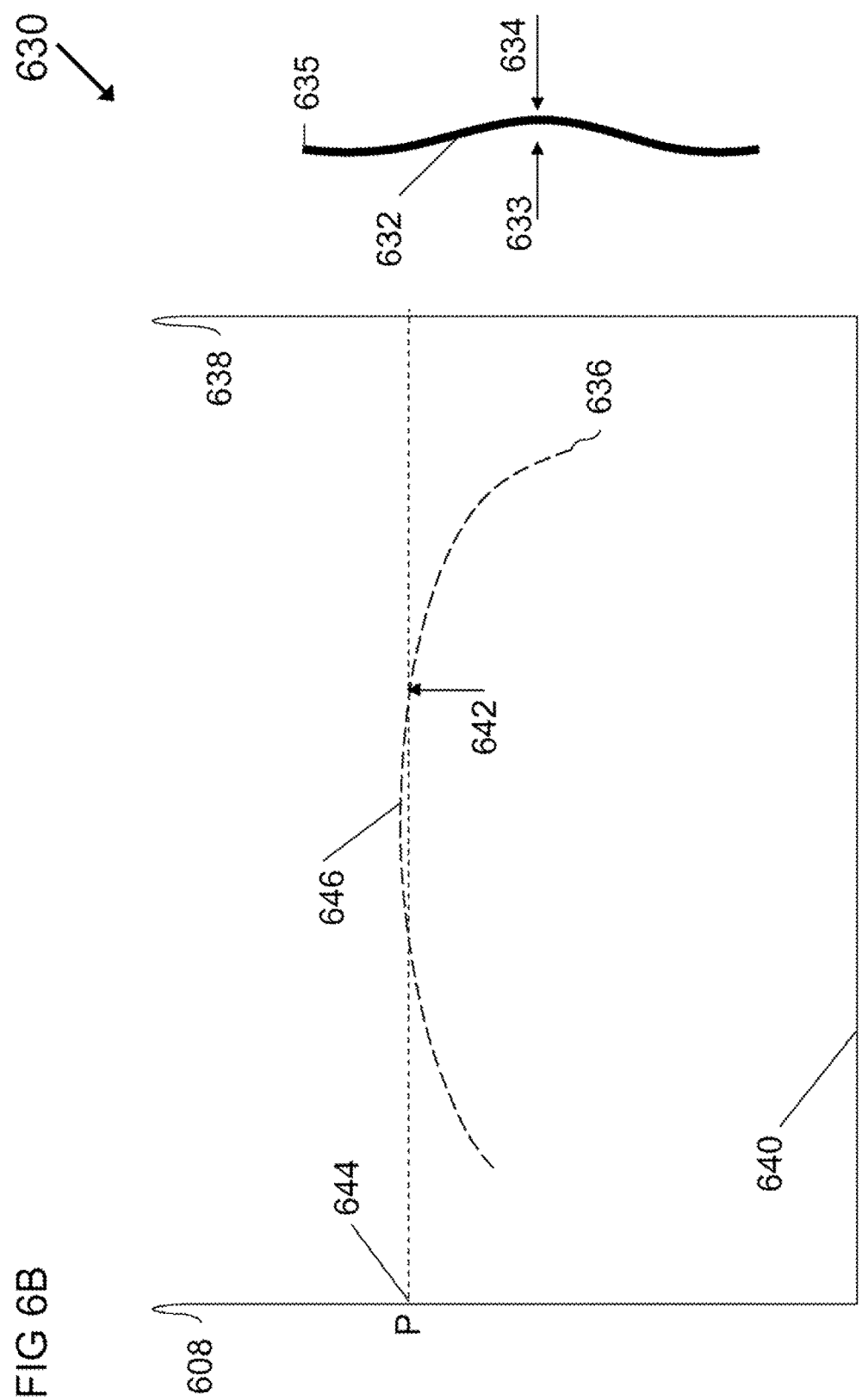
FIG. 6B illustrates a force-displacement characteristic of a second buckled membrane, according to embodiments of the invention.
Figure 6C:
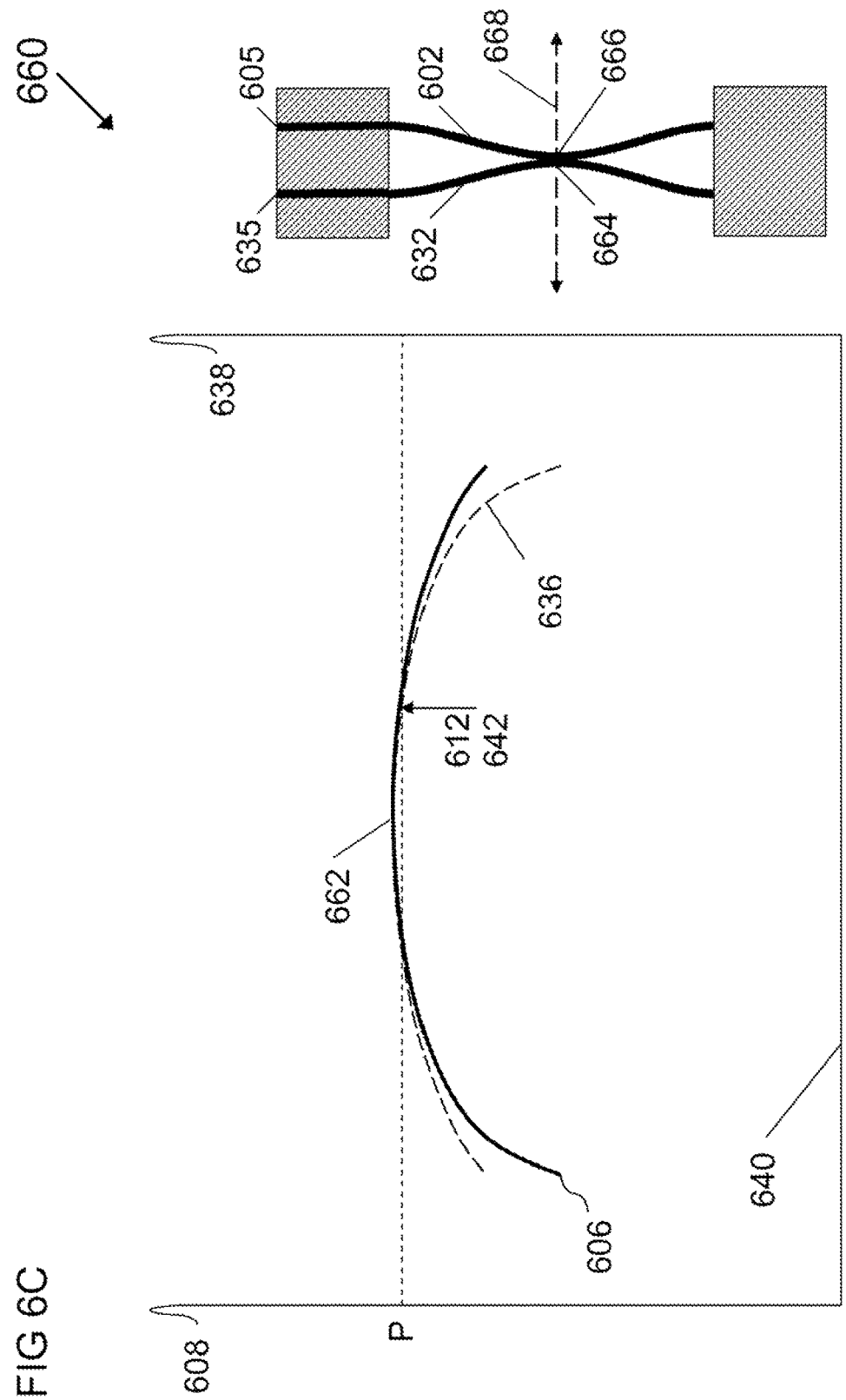
FIG. 6C illustrates aligning load/displacement responses of two coupled buckled membranes to produce a reduced stiffness zone, according to embodiments of the invention.

Referring to FIGS. 6A, 6B, and 6C, FIG. 6A illustrates a force-displacement characteristic of a buckled membrane, according to embodiments of the invention. A first buckled membrane is shown generally at 600 in FIG. 6A. A first buckled membrane 602 has a buckling direction indicated at 603; the first buckled membrane 602 is part of a first buckling layer 605. The first buckled membrane 602 is loaded at 604, which causes the membrane to deflect opposite to the buckling direction 603. A force-displacement plot is shown at 606 with force plotted on the vertical axis at 608 and displacement along a horizontal axis at 610. In one embodiment, the force-displacement plot 606 is the measurement shown earlier in FIG. 2C.

The load 604, applied to the first buckled membrane 602, is plotted at 614, the load 614 produces a displacement 612 as indicated on curve 606. A point 616 indicates the zero slope of the force-displacement plot 606 which is where the stiffness of the first buckled membrane 602 is zero.

Referring now to 630 in FIG. 6B, a second buckled membrane 632 is positioned to oppose the first buckled membrane 602. The second buckled membrane 632 is part of a second buckling layer 635. The second buckled membrane 632 is designed to have a force-displacement characteristic 636 that is identical to the force-displacement characteristic 606 of the first buckled membrane 602. As used in this detailed description of embodiments, the term "opposing" refers to the situation where membranes have buckled in the opposite direction. Such a case is illustrated by buckling direction 633 (arrow to the right) which is opposite to the buckling direction 603 (arrow to the left) of the first buckled membrane 602.

A load 634 displaces the second buckled membrane 632 to the left. A point 646, on the displacement axis, indicates the zero slope of the force-displacement plot 636 which is where the stiffness of the second buckled membrane 632 is zero.

Referring now to 660 in FIG. 6C, the first buckled membrane 602 and the second buckled membrane 632 have been brought together into contact with each other, thereby developing a mutual preload, to the point where the point 616 and the point 646 overlap each other, resulting in point 662. Such a condition is referred to as aligning the force-displacement responses or characteristics of the two opposing membranes. The force 612 and 642 represent equal and opposite forces applied to buckled membrane 602 and 632, respectively. Loads 612 and 642 are indicated in 660 as coincident with each other.

FIG. 7A illustrates an operating zone of a reduced stiffness microstructure (RSM), from 660 in FIG. 6C, according to embodiments of the invention. Referring now to FIG. 6A, 6B 6C, and FIG. 7A, the opposing buckled membranes were selected to provide very similar to identical force-displacement responses. In this case, a zero-stiffness operating zone was desired, the aligned opposing buckled membranes provide a zero-stiffness operating zone indicated at 702. In the operating zone, a force applied to a membrane surface at 664 or 666, which is along the buckling directions 668 of the membranes, produces motion of the buckled membrane microstructure.

Asymmetry in the force-displacement characteristics results in a net non-zero force exerted between the membranes along the buckling axis in two zones. These two zones function as potential energy stops which provide restorative forces that help keep the opposing buckled membranes in the operating zone 702. Two such non-zero force conditions are illustrated in FIG. 7A A first zone where the net force between the membranes is non-zero is indicated at a zone 704. In the zone 704, the second buckled membrane 632 exerts a force on the first buckled membrane 602 which is larger than the opposing force exerted by the first buckled membrane 602 (e.g. 706 on the curve 636), thereby causing the opposing buckled membranes to move to the right for displacement positions in the zone 704, such as 712. At displacement 712, the net non-zero force exerted on the opposing buckled membranes is the difference between the curve 636 and the curve 606, which is indicated at 710. The force-displacement characteristics 606 and 636 for the buckled membranes 602 and 632 diverge in the zone 704 resulting in a potential energy stop at a first limit of the translation range 668 (FIG. 6C in 660). At displacement 712 the net non-zero force 710 manifests on the opposing buckled membranes as indicated by an arrow 713 which provides a restorative force tending to return the opposing buckled membranes to the operating zone 702.

A second zone where the net force between the opposing buckled membranes is non-zero in indicated at 708, which is to the right of the operating zone 702. In the zone 708, the first buckled membrane 602 exerts a force on the second buckled membrane 632 which is larger than the opposing force exerted by the second buckled membrane 632 (e.g., 716 on the curve 606), thereby causing the opposing buckled membranes to move to the left for displacement positions in the zone 708, such as 714. At displacement 714, the net non-zero force exerted on the opposing buckled membranes is the difference between the curve 606 and the curve 636, which is indicated at 720. The force/displacement characteristics 606 and 636 for the buckled membranes 602 and 632 diverge in the zone 708 resulting in a second potential energy stop at a second limit of the translation range 668 (FIG. 6C in 660). At displacement 714 the net non-zero force 720 manifests on the opposing buckled membranes as indicated by an arrow 722 which provides a restorative force tending to return the opposing buckled membranes to the operating zone 702. Thus, a potential energy well is created with two opposing buckled membranes with force-displacement characteristics that have been aligned.

The dynamic response to motion, described directly above, the case where a zero-stiffness zone is created in an RSM can be referred to as a potential energy well. At one end of the translation range, along the buckling directions or axes 668, a first potential energy stop exists within the zone at 704. A second potential energy stop exists at the other end of the translation range within the zone 708. In the zero-stiffness zone 702, applied, force results in kinetic energy or motion and flexing of the buckled membranes along 668. The motion of the buckled membranes along 668 (in the operating zone 702) results in a decrease in potential energy of one membrane with a corresponding simultaneous increase in potential energy of the other membrane while the contact area of the membranes translates along the buckling directions or axes 668. Outside of the operating zone 702, the potential energy of one buckled membrane is larger than the potential energy of the other buckle membrane. This condition results in a potential energy stop as previously described.

The alignment illustrated in FIG. 7A illustrates a method to achieve a zero-stiffness elastic micro-mechanical structure (RSM). Variations from zero are obtained in different ways, according to different embodiments. In one method, the membranes do not have identical force-displacement characteristics. This is accomplished by making one membrane stiffer than the other. Membrane stiffness is related to membrane thickness, as well as to membrane composition, such as membrane area, materials, etc. Therefore, in order to create membranes with different force-displacement characteristics, the membranes are intentionally made to be non-identical to each other. One example of non-identical force-displacement characteristics is illustrated in FIG. 7B.

FIG. 7B illustrates, generally at 750, another operating zone of a reduced stiffness microstructure, according to embodiments of the invention. With reference to FIG. 7B, a single operating zone is illustrated for a RSM. A force-displacement curve 756 results from a first buckled membrane. A second buckled membrane has a force-displacement curve represented by 758. Force is plotted on an axis 752 and displacement of the contact area is plotted on an axis 753. Both buckled membranes are in contact with each other and a state of preload exists between the two buckled membranes, which causes the membranes' force-displacement characteristics 756 and 758 to become aligned. However, in the present case, there is always a non-zero force existing between the buckled membranes. The magnitude of the force is represented by the difference between force-displacement characteristics 756 and 758. For example, at a displacement indicated at 754 the non-zero force is indicated at 760. Note that the magnitude of 760 is smaller than either 762 or 764. Thus, a reduced stiffness microstructure results from the two opposing buckled membranes with non-identical mechanical properties.

Figure 8:
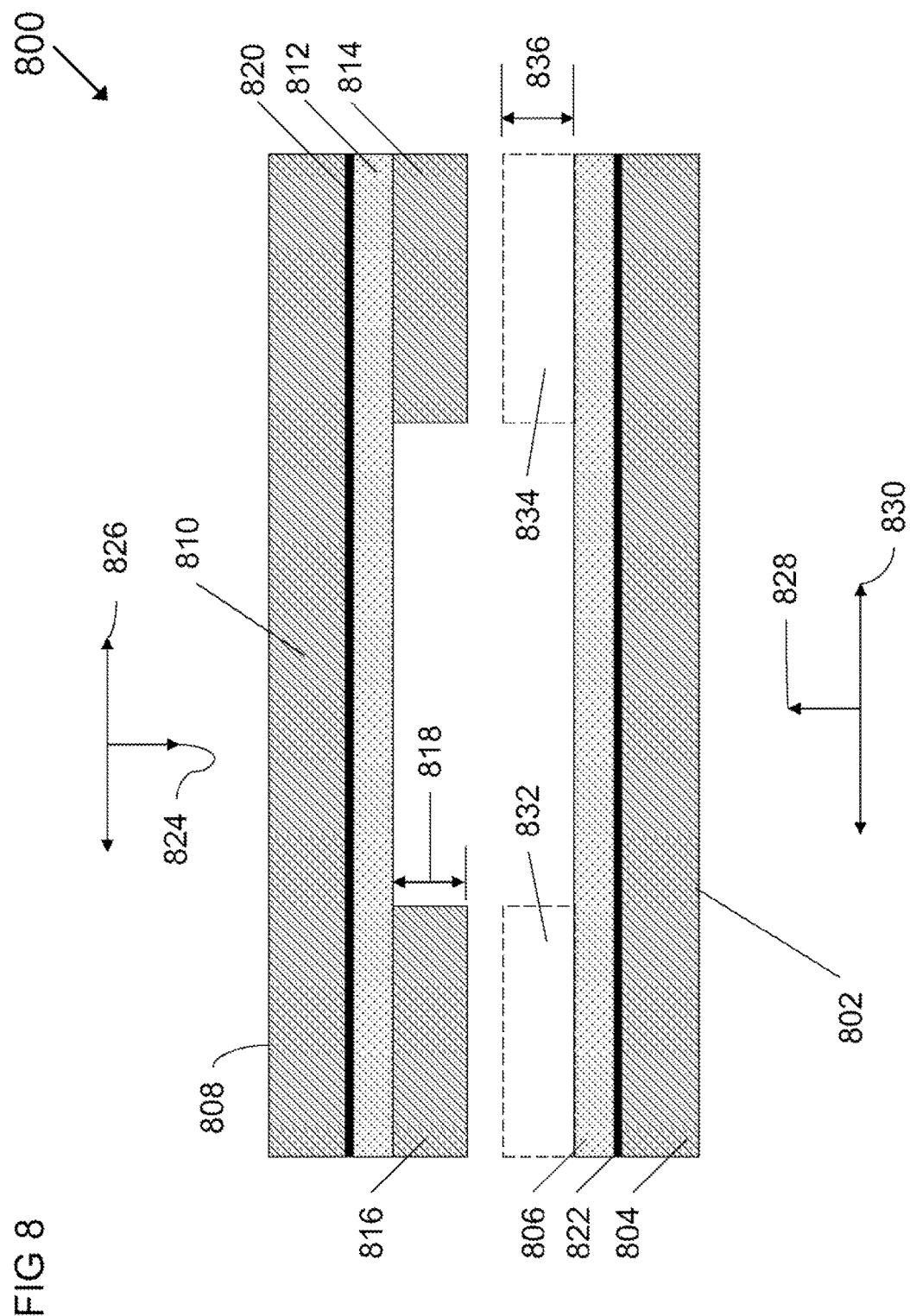
FIG. 8 illustrates locating two substrates, according to embodiments of the invention.

FIG. 8 illustrates, generally at 800, locating two substrates, according to embodiments of the invention. With reference to FIG. 8, in one embodiment, the opposing buckled membranes previously discussed are constructed on separate substrates and then the substrates are located via micromanipulation before joining the substrates together. Buckled membranes can be released from their respective substrates either before joining the substrates together or after the substrates are joined together via the methods previously described or by methods as of yet unknown. Embodiments of the invention are not limited by the way in which a buckled membrane is released from the substrate.

In one embodiment, a first multilayered microstructure 802 has a substrate indicated at 804 and a multi-layered buckling layer indicated by layers 822 and 806. In one embodiment, 822 is a layer of silicon dioxide, 806 is a layer of mono-silicon, and 804 is mono-silicon. A second multi-layered microstructure 808 has a substrate indicated at 810 and a multilayered buckling layer 820 and 812. In one embodiment, 810 is a mono-silicon layer, 820 is a layer of silicon dioxide, and 812 is a layer of mono-silicon. In one embodiment, spacers 814 and 816 are made from poly-silicon and are deposited on 812. A thickness 818 of the spacers is selected to provide the proper initial displacement of the buckled membranes following release of the membranes from their substrates. In the examples given in conjunction with FIG. 6A, 6B, 6C, and FIG. 7A, the desired initial displacement of the opposing buckled membranes is indicated as 616 and 646 (616 is equal to 646 in the example of FIGS. 6A and 6B). Therefore, the thickness 818 of the spacer 814 and 816 is two times the displacement 616. Alternatively, the thickness of the spacers 816/814 can be selected to provide a different force-displacement characteristic for the opposing coupled buckled membranes according to the teaching presented herein.

To provide the correct distance between buckled membranes, the spacers 816 and 814 can be chemically mechanically polished to planarize the deposited surface. Alternatively, optional spacers 832 and 834 can be deposited onto the layer 806. In such a case, the thickness 818 of the spacer 816 and 814 combined with the thickness 836, of the spacers 832 and 834, to equal two times the displacement 616 (which is also equivalent to the displacement 646 or 662). For example, the thickness 818=836=616. Alternatively, when two spacers are used, the desired separation between the top surfaces of the opposing budding layers can be apportioned between the two spacers by any fractional distribution.

The substrate 808 and the substrate 802 are located relative to one another by micromanipulation, indicated by arrows 826 and 830 and then the substrates are brought into contact with one another as indicated with arrows 824 and 828. The substrates are joined together by various means such as direct bonding, Plasma Activated bonding, Eutectic bonding, etc. Those of skill in the art will recognize other bonding methods that are suitable for this use. The bonding methods listed herein are given by way of example and do not limit embodiments of the invention.

Figure 9:
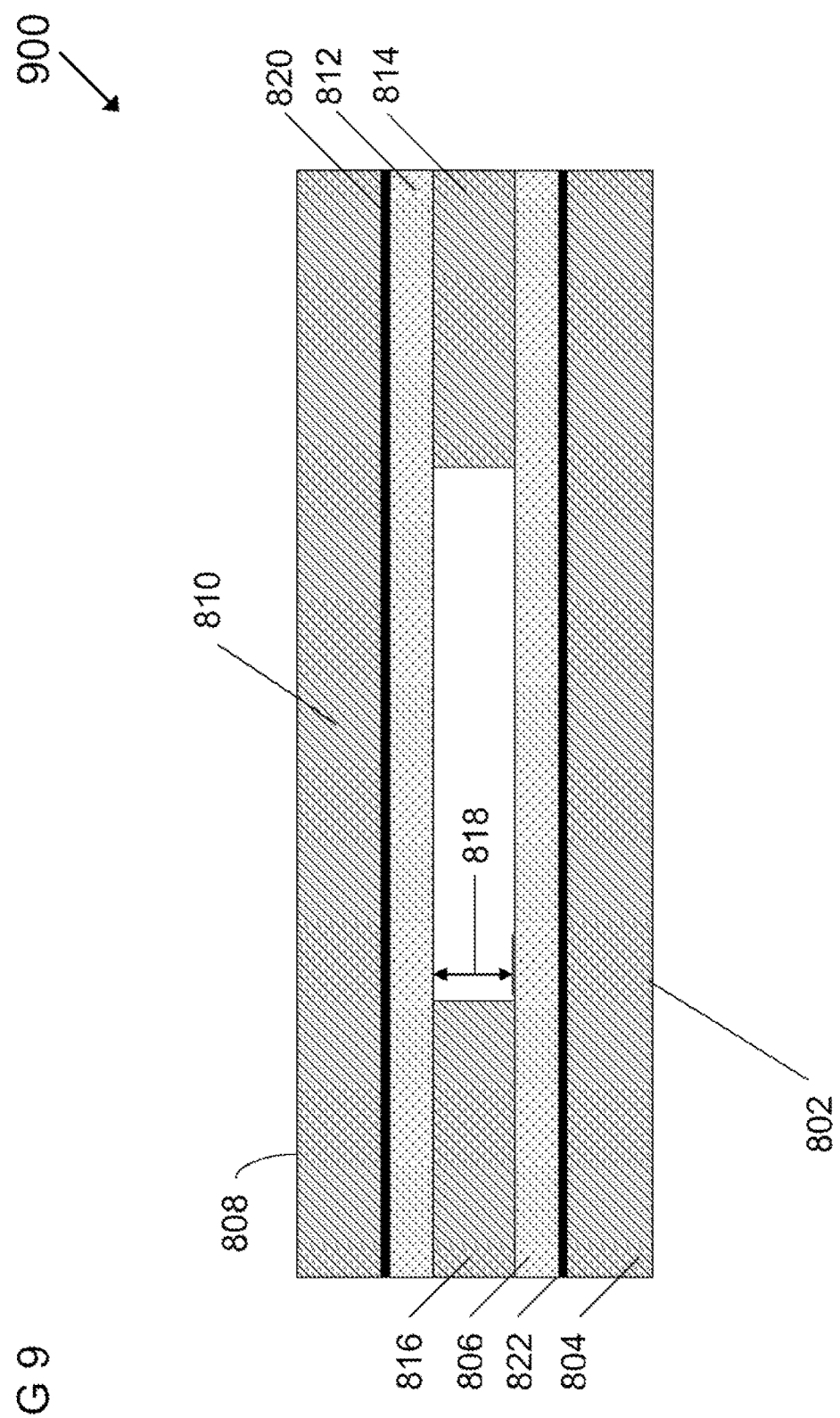
FIG. 9 illustrates bonding two substrates together, according to embodiments of the invention.

FIG. 9 illustrates, generally at 900, bonding two substrates together, according to embodiments of the invention. With reference to FIG. 9, the two substrates described in FIG. 8 are shown bonded together in 900. Note that in FIG. 9, the membranes have not yet been released from the substrates. Following bonding of the substrates, buckled membranes are released from the substrate 808 and 802. In one embodiment the outer surface of 808 and 802 are patterned and etched to remove substrate 804 and 810 from the region between the spacers. The resulting microstructure is shown in FIG. 10.

Figure 10:
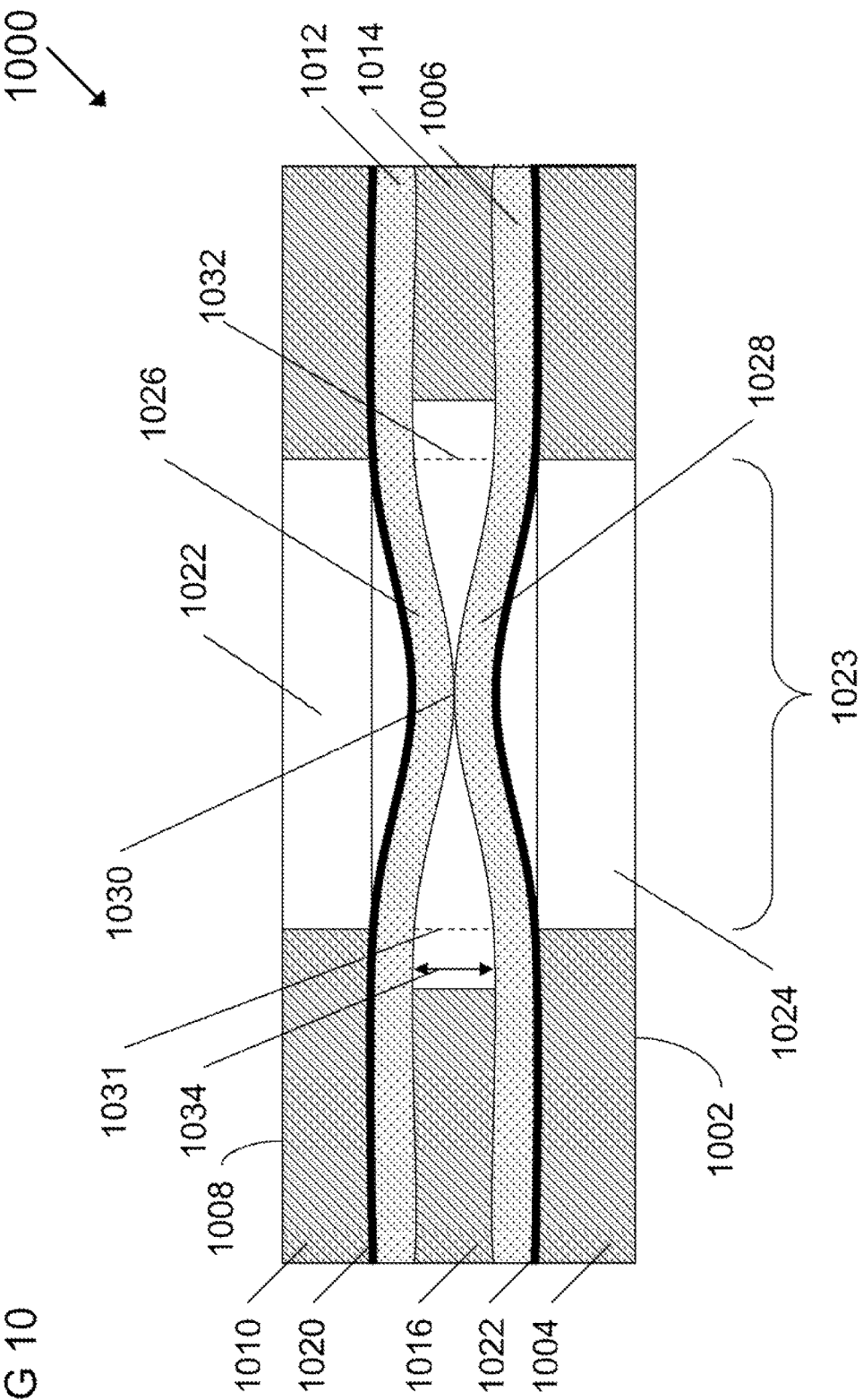
FIG. 10, illustrates a pair of coupled buckled membranes, according to embodiments of the invention.

FIG. 10 illustrates the state of the buckled membranes after the membranes have been release from the substrates. Alternatively, in some embodiments, the membranes are released before the substrates are joined together. In such a case the membranes are released before the substrates are joined together and care is taken to align buckled membranes from one substrate with buckled membranes from the other substrate. Membranes are released following any of the methods known to those of skill in the art. The example given above is for the purpose of illustration and does not limit embodiments of the invention in any way.

FIG. 10, illustrates, generally at 1000, a pair of coupled buckled membranes, according to embodiments of the invention. With reference to FIG. 10, a multi-layered microstructure 1002 has a substrate 1004 and a first multi-layered buckling layer, which includes a sub-layer 1022 and a sub-layer 1006. A first buckled membrane 1028 has been released by removal of the substrate 1024 over an area 1023.

A multi-layered microstructure 1008 has a substrate 1010 and a second multi-layered buckling layer, which includes a sub-layer 1012 and a sub-layer 1020. A second buckled membrane 1026 has been released by removal of the substrate 1022 over an area 1023. Removal of substrate 1024 and 1022 cause the first buckled membrane 1028 to contact the second buckled membrane 1026 over a contact area 1030.

A thickness 1034 of spacers 1014 and 1016 has been designed to provide the desired force-displacement characteristic for the reduced stiffness microstructure (RSM). Spacers 1014 and 1016 can be sized to provide an open area (void) between the buckled membranes that is not the same size as the area indicated at 1023. Such variation is indicated by dashed lines 1031 and 1032.

In one or more embodiments, the RSM of FIG. 10 has been designed according to the descriptions presented in support of the previous figures to produce a zero-stiffness RSM or a reduced stiffness RSM.

Figure 11:
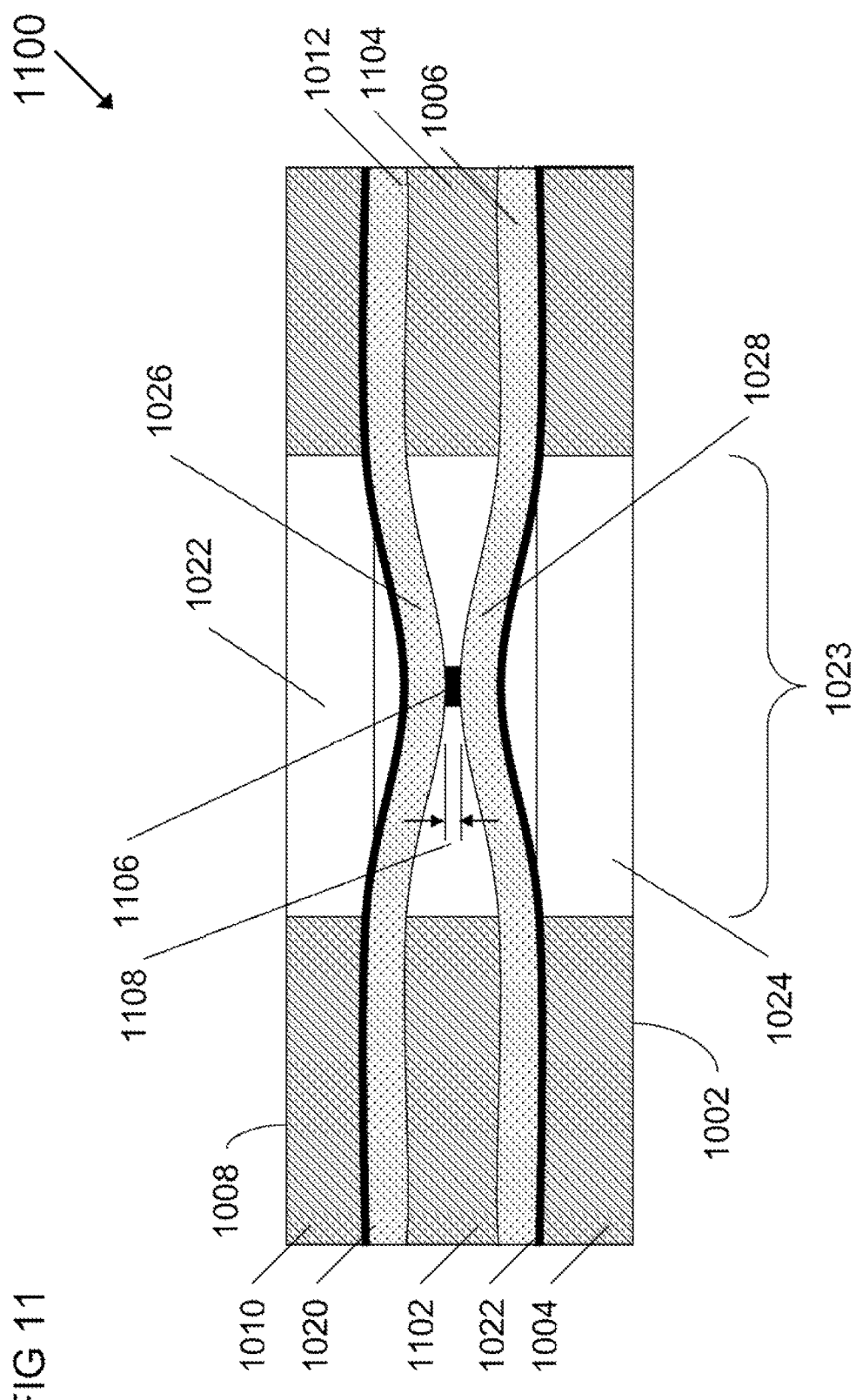
FIG. 11 illustrates a mass captured between a pair of coupled buckled membranes, according to embodiments of the invention.

FIG. 11 illustrates, generally at 1100, a mass (or spacer) located between a pair of coupled buckled membranes, according to embodiments of the invention. With reference to FIG. 11, a mass 1106 is deposited on one of the buckling layers (1028 or 1026) before the substrates are aligned and bonded together, such as in the state of assembly shown in FIG. 8. The thickness of the spacers 1102 and 1104 is sized to accommodate the added thickness of the mass 1106, consistent with the desired elastic response of the RSM. For example, if a mass 1106 were added to the RSM of FIG. 10, an added thickness 1108 is added to the thickness 1034 of the spacers 1014 and 1016 in order to preserve the elastic response of the RSM.

The potential energy well described above in conjunction with a RSM that has a zero-stiffness zone provides potential energy boundaries which serve to limit the displacement of a pair of opposing coupled buckled membranes. If excitation energy is sufficiently high, the pair of coupled buckled membranes can travel outside of the potential energy well boundaries and "pop through" to one side or the other. Popping through can be prevented with mechanical stops. FIG. 12 illustrates mechanical stops used with a pair of coupled buckled membranes, according to embodiments of the invention.

Figure 12A:
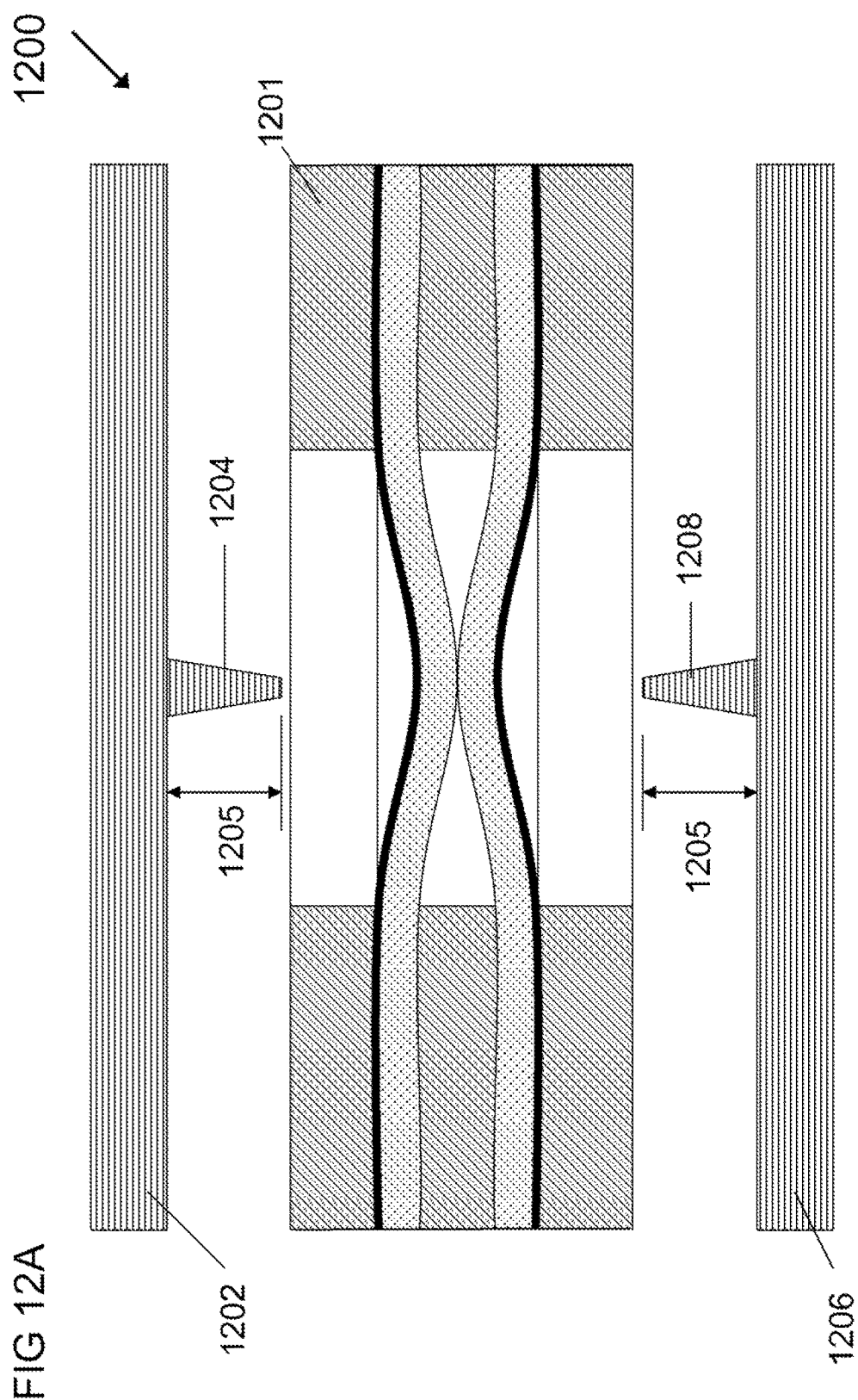
FIG. 12A, illustrates stops used with a pair of coupled buckled membranes in an exploded view, according to embodiments of the invention.

With reference to FIG. 12A, a RSM is shown at 1201. In one embodiment, 1201 is the RSM 1000 from FIG. 10. An upper layer 1202 has been micro machined to produce a stop 1204 which has a height or thickness 1205. A lower layer 1206 has been micro machined to produce a stop 1208, which has a height 1205.

Figure 12B:
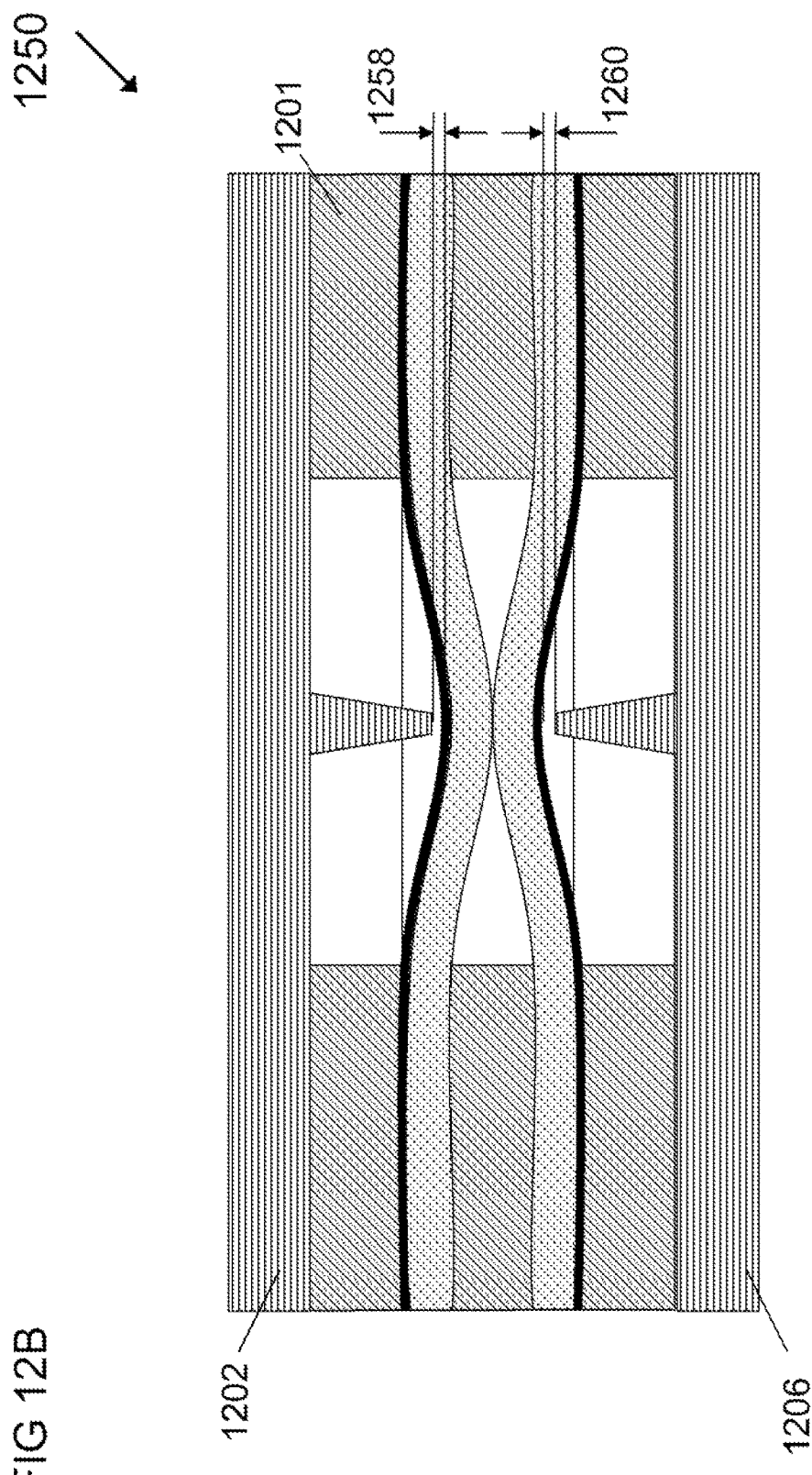
FIG. 12B, illustrates stops used with a pair of coupled buckled membranes, according to embodiments of the invention.

In FIG. 12B at 1250 the upper layer 1202 and the lower layer 1206 have been bonded to the RSM 1201. The upper layer 1202 and the lower layer 1206 are positioned through micromanipulation to place the stops at a desired location. Desired locations can be any position behind the buckled membrane. For example, the stop 1204 or stops 1204/1208 can be centered on the buckled membrane's area, off to one side, etc. The stop can be arrayed as a single stop (as shown in FIG. 12A and FIG. 12B) or the stop 1204 can be a plurality of stops.

The stops 1204 and 1208 limit the travel of the coupled buckled membranes to the distance shown at 1258 and 1260. A measurement of the force-displacement characteristic of a buckled membrane will provide the information needed to determine the distance represented by 1258 and 1260. Referring to FIG. 7A, one design point can be to set 1258 equal to one half of the width of the operating zone 702. Another design point can be wider, which can include a portion of zone 704 and 708, keeping in mind the desire to prevent pop through. Alternatively, the stops can be located to allow pop through.

RSM devices incorporating coupled buckled membranes can be made from a single substrate in order to avoid micromanipulation of separate substrates. A pair of opposing buckled membranes needs a cavity into which the membranes buckle into and then contact each other following release. Such cavities can be created by etching into a multilayered microstructure, such as one made from a series of layers of silicon on insulator (SOI). Following creation of a cavity, membranes can be released by etching each respective surface or by ion bombardment on the respective surfaces.

Embodiments of the RSM structure presented above can be utilized in a host of MEMS or MOEMS devices. One such device is a capacitive MEMS switch. A RSM used in a capacitive MEMS switch requires very low maintaining voltage because of the very low (including zero) stiffness provided by the RSM. In one embodiment, such a switch is opened through electrostatic repulsion and kept closed through stiction, thereby requiring very low to no maintaining voltage.

In an ohmic MEMS switch the coupled buckled membrane of a RSM device can be utilized as either the contact mounting surface or the structure that comes into contact with a stationary contact. In one embodiment, the mechanical stops described in above in FIG. 12 can be used as contacts of a switch. In one embodiment, the distances 1208 and 1210 are set to allow the coupled buckled membrane to pop through, thereby creating a state for the switch in a "popped through" position for the coupled buckled membrane. The degree of restoring force and actuation force is determined by alignment of the force-displacement characteristics of the membranes and by the design of the buckled membranes.

RSM devices have application in a host of MEMS and MOEMS devices as described above. A non-limiting list of such devices include: stress relief, passive energy damping, pressure control, support structure, entropy reduction devices, energy transfer devices, energy harvesting devices, pressure sensors, etc.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A method to create a reduced stiffness microstructure, comprising:
   forming a first buckled membrane along a first buckling direction; and
   forming a second buckled membrane along a second buckling direction, the second buckling direction is opposite to the first buckling direction, the first buckled membrane is in contact with the second buckled membrane over a contact area, within an operating zone a stiffness of the reduced stiffness microstructure during contact is less than an absolute value of a stiffness of at least one of the first buckled membrane, before contact, and the second buckled membrane, before contact, when the contact area translates along either one of the first buckling directions and the second buckling direction.

2. The method of claim 1, further comprising:
   aligning a force-displacement response of the first buckled membrane to a force-displacement response of the second buckled membrane.

3. The method of claim 2, wherein the aligning is performed to minimize a stiffness of the reduced stiffness microstructure by adjusting a mutual preload between the first buckled membrane and the second buckled membrane until a resulting displacement of the first and second buckled membranes places the first and second buckled membranes in their zero stiffness zone.

4. The method of claim 3, wherein the aligning is accomplished with a mass placed between the first buckled membrane and the second buckled membrane.

5. The method of claim 3, wherein the aligning is accomplished by adjusting a distance between the first buckled membrane and the second buckled membrane.

6. The method of claim 2, wherein the aligning is accomplished by spacing apart the first buckled membrane and the second buckled membrane.

7. The method of claim 2, wherein the aligning is accomplished by adjusting a composition of one of the first buckled membrane and the second buckled membrane.

8. The method of claim 1, wherein the contact between the first buckled membrane and the second buckled membrane causes the membranes to be under a preload.

9. The method of claim 1, wherein the first buckled membrane is bonded to the second buckled membrane over the contact area.

10. The method of claim 1, wherein an area of the first buckled membrane is substantially equal to an area of the second buckled membrane.

11. The method of claim 1, wherein an area of the first buckled membrane is different from an area of the second buckled membrane.

12. The method of claim 1, further comprising:
    restraining translation along either one of the first buckling direction and the second buckling direction.

13. The method of claim 1, further comprising:
    locating a first substrate relative to a second substrate, wherein the first buckled membrane is part of the first substrate, the second buckled membrane is part of the second substrate and the locating causes a center of the first buckled membrane and a center of the second buckled membrane to be on a same axis.

* * * * *